US012733285B2

(12) United States Patent
Yanagawa et al.

(10) Patent No.: US 12,733,285 B2
(45) Date of Patent: Sep. 8, 2026

(54) SEMICONDUCTOR DEVICE, ELECTRONIC DEVICE, AND METHOD FOR MANUFACTURING SEMICONDUCTOR DEVICE

(71) Applicant: SONY GROUP CORPORATION, Tokyo (JP)

(72) Inventors: Yoshiaki Yanagawa, Kanagawa (JP); Takushi Shigetoshi, Kanagawa (JP)

(73) Assignee: SONY GROUP CORPORATION, Tokyo (JP)

( * ) Notice: Subject to any disclaimer, the term of this patent is extended or adjusted under 35 U.S.C. 154(b) by 368 days.

(21) Appl. No.: 18/260,255

(22) PCT Filed: Dec. 22, 2021

(86) PCT No.: PCT/JP2021/047716

§ 371 (c)(1),
(2) Date: Jul. 3, 2023

(87) PCT Pub. No.: WO2022/153814

PCT Pub. Date: Jul. 21, 2022

(65) Prior Publication Data

US 2024/0055461 A1 Feb. 15, 2024

(30) Foreign Application Priority Data

Jan. 13, 2021 (JP) ................................ 2021-003516

(51) Int. Cl.
*H10F 39/00* (2025.01)

(52) U.S. Cl.
CPC ......... *H10F 39/811* (2025.01); *H10F 39/018* (2025.01); *H10F 39/024* (2025.01); *H10F 39/8057* (2025.01); *H10F 39/809* (2025.01)

(58) Field of Classification Search
CPC .... H10F 39/811; H10F 39/018; H10F 39/024; H10F 39/8057; H10F 39/809
See application file for complete search history.

(56) References Cited

U.S. PATENT DOCUMENTS

| | | | | |
|---|---|---|---|---|
| 2018/0012867 | A1* | 1/2018 | Kim | H05K 1/115 |
| 2018/0145104 | A1* | 5/2018 | Kim | H10F 39/809 |

FOREIGN PATENT DOCUMENTS

| | | | |
|---|---|---|---|
| JP | 2005-019521 | A | 1/2005 |
| JP | 3970210 | B2 * | 9/2007 |
| JP | 2015-088618 | A | 5/2015 |
| JP | 2016-171256 | A | 9/2016 |
| JP | 2018-200944 | A | 12/2018 |

OTHER PUBLICATIONS

International Search Report and Written Opinion of PCT Application No. PCT/JP2021/047716, issued on Mar. 15, 2022, 09 pages of ISRWO.

* cited by examiner

*Primary Examiner* — Monica D Harrison
*Assistant Examiner* — Woo K Lee
(74) *Attorney, Agent, or Firm* — CHIP LAW GROUP

(57) ABSTRACT

Provided are a semiconductor device capable of constituting a through electrode having a desired shape, an electronic device, and a method for manufacturing a semiconductor device. The semiconductor device includes a first substrate including silicon, a first film formed on at least some surfaces of a hole-shaped portion formed in the first substrate, and a photosensitive second film covering at least a part of a side surface of the hole-shaped portion with the first film interposed therebetween.

15 Claims, 23 Drawing Sheets

SEMICONDUCTOR DEVICE, ELECTRONIC DEVICE, AND METHOD FOR MANUFACTURING SEMICONDUCTOR DEVICE

CROSS REFERENCE TO RELATED APPLICATIONS

This application is a U.S. National Phase of International Patent Application No. PCT/JP2021/047716 filed on Dec. 22, 2021, which claims priority benefit of Japanese Patent Application No. JP 2021-003516 filed in the Japan Patent Office on Jan. 13, 2021. Each of the above-referenced applications is hereby incorporated herein by reference in its entirety.

TECHNICAL FIELD

The present disclosure relates to a semiconductor device, an electronic device, and a method for manufacturing of a semiconductor device.

BACKGROUND ART

There is known a wafer level chip size package (CSP) in which a semiconductor device is downsized to a chip size. As the wafer level CSP of a solid-state imaging device, glass is bonded to a front-surface type solid-state imaging device in which a color filter and an on-chip lens are formed, in a cavity structure, and a through hole and a connection conductor are formed from a silicon substrate side to form a through electrode.

The connection conductor connected to a redistribution layer is formed via an insulating film formed in the through hole. This insulating film is patterned using exposure and development of the lithography technology, for example.

CITATION LIST

Patent Document

Patent Document 1: Japanese Patent Application Laid-Open No. 2018-200944

SUMMARY OF THE INVENTION

Problems to be Solved by the Invention

However, there is a possibility that a designed insulating film shape cannot be obtained due to scattered light during exposure or the like. Furthermore, as the thickness of the insulating film increases, the connectivity between the silicon substrate on which the through hole is formed and the insulating film may decrease.

Therefore, in the present disclosure, provided are a semiconductor device capable of constituting a through electrode having a desired shape, an electronic device, and a method for manufacturing a semiconductor device.

Solutions to Problems

In order to solve the problems described above, according to the present disclosure, there is provided a semiconductor device including:

a first substrate including silicon;

a first film formed on at least some surfaces of a hole-shaped portion formed in the first substrate; and a photosensitive second film covering at least a part of a side surface of the hole-shaped portion with the first film interposed therebetween.

The first film may absorb light having a wavelength sensitive to the second film.

The first film may have a different thickness depending on a position where the first film is formed.

The first film may have different absorption characteristics or reflection characteristics of the light depending on the thickness.

The first film may have an adsorption force of a predetermined value or more with respect to the first substrate and the second film.

The first film may be a substance containing at least one of silicon nitride (SiN), silicon oxynitride (SiOxNy), or titanium nitride (TiN).

The second film may be an insulating film.

The second film may be a substance containing at least one of polyimide, silicone, acryl, epoxy, or spin-on carbon (SOC).

The semiconductor device may further include a multilayer wiring layer connected to the first substrate, and the hole-shaped portion may be a through hole penetrating the multilayer wiring layer from one surface of the first substrate.

The semiconductor device may further include:

a first connection conductor that covers the multilayer wiring layer through which the through hole penetrates and the through hole in which the second film is formed;

an electrode formed on a side of the one surface of the first substrate and electrically connected to an external substrate; and a second connection conductor that connects the connection conductor and the electrode.

The first film may be formed on at least a part of the one surface of the first substrate, a side wall surface of the through hole, and a surface of the multilayer wiring layer on a side of the first substrate.

The first film may be formed only on a side wall surface of the through hole.

The first film may be formed only on a bottom portion of the through hole.

The second film may be formed on the one surface of the first substrate and a side wall surface of the through hole.

At least one of a logic circuit, a memory circuit, a control circuit, or an interposer may be configured in the multilayer wiring layer.

The semiconductor device may further include a second semiconductor substrate formed with a pixel region in which pixel units that perform photoelectric conversion are two-dimensionally arranged, and the logic circuit may process a pixel signal output from the pixel units.

In order to solve the problems described above, according to the present disclosure, there is provided an electronic device including:

a first substrate including silicon;

a first film formed on at least some surfaces of a hole-shaped portion formed in the first substrate; and a photosensitive second film covering at least a part of a side surface of the hole-shaped portion with the first film interposed therebetween.

In order to solve the problems described above, according to the present disclosure, there is provided a method for manufacturing a semiconductor device including steps of:

forming a first hole-shaped portion in a first substrate including silicon;

forming a first film in the first hole-shaped portion;

depositing a photosensitive material on the first hole-shaped portion in which the first film has been formed;

exposing a predetermined region of the photosensitive material to light;

patterning the photosensitive material that has been exposed to light; and etching a bottom portion of the first hole-shaped portion.

MODE FOR CARRYING OUT THE INVENTION

First Embodiment

In the following description, an upper substrate 12 on which at least a pixel region 21 is formed will be referred to as a pixel sensor substrate 12, and a lower substrate 11 on which at least a logic circuit 23 is formed will be referred to as a logic substrate 11.

<Embodiment of Solid-State Imaging Device>

<Schematic External View>

Figure 1:
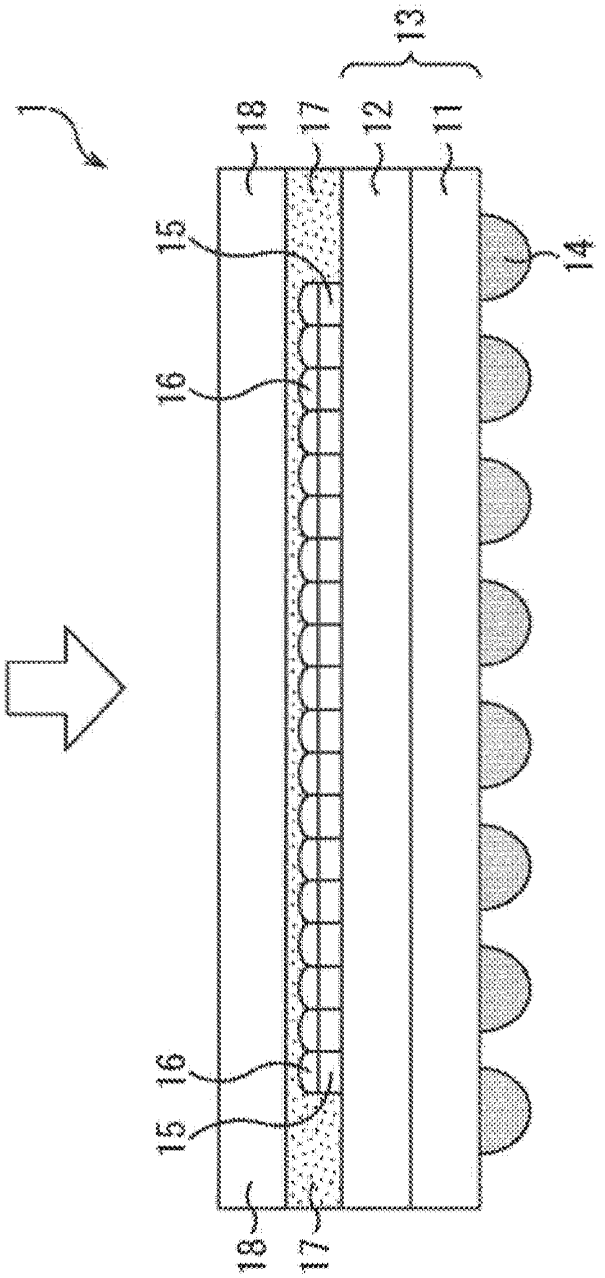
FIG. 1 is a schematic external view of a solid-state imaging device according to the present disclosure.

FIG. 1 is a schematic external view of a solid-state imaging device as a semiconductor device according to the present disclosure.

A solid-state imaging device 1 illustrated in FIG. 1 is a semiconductor package in which a multi-layer substrate 13 configured by stacking a lower substrate 11 and an upper substrate 12 is packaged.

On the lower substrate 11, a plurality of solder balls 14, which are back electrodes for electrical connection with an external substrate (not illustrated), are formed.

On an upper surface of the upper substrate 12, red (R), green (G), or blue (B) color filters 15 and an on-chip lens 16 are formed. Furthermore, the upper substrate 12 is connected to a glass protection substrate 18 for protecting the on-chip lens 16 via a glass seal resin 17 in a cavity-less structure.

Figure 2A:
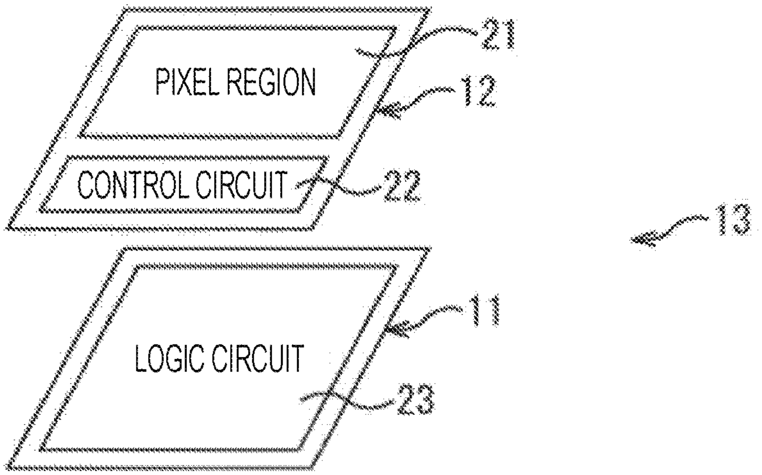
FIGS. 2A and 2B are diagrams for explaining a substrate configuration of the solid-state imaging device.

For example, as illustrated in FIG. 2A, a pixel region 21 in which pixel units that perform photoelectric conversion are two-dimensionally arranged and a control circuit 22 that controls the pixel units are formed on the upper substrate 12, and a logic circuit 23 such as a signal processing circuit that processes pixel signals output from the pixel units is formed on the lower substrate 11.

Figure 2B:
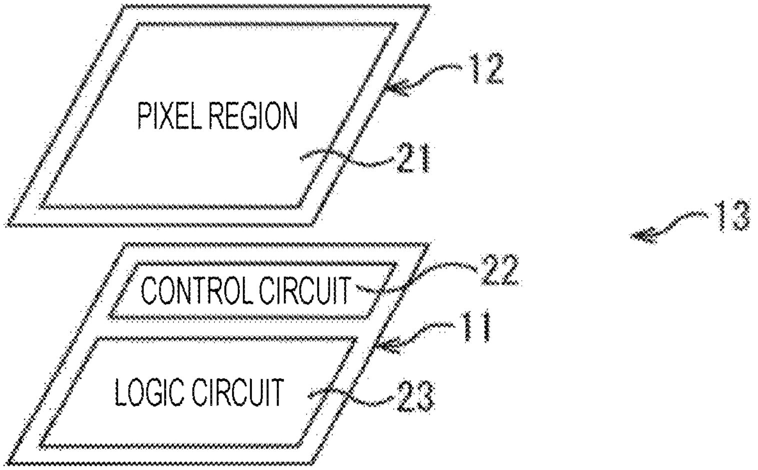

Alternatively, furthermore, as illustrated in FIG. 2B, only the pixel region 21 may be formed on the upper substrate 12, and the control circuit 22 and the logic circuit 23 may be formed on the lower substrate 11.

As described above, by forming and stacking both the logic circuit 23 or the control circuit 22 and the logic circuit 23 on the lower substrate 11 different from the upper substrate 12 of the pixel region 21, the size of the solid-state imaging device 1 can be reduced as compared with a case where the pixel region 21, the control circuit 22, and the logic circuit 23 are disposed in one semiconductor substrate in the planar direction.

In the following description, the upper substrate 12 on which at least the pixel region 21 is formed will be referred to as a pixel sensor substrate 12, and the lower substrate 11 on which at least the logic circuit 23 is formed will be referred to as a logic substrate 11.

<Configuration Example of Multi-Layer Substrate>

Figure 3:
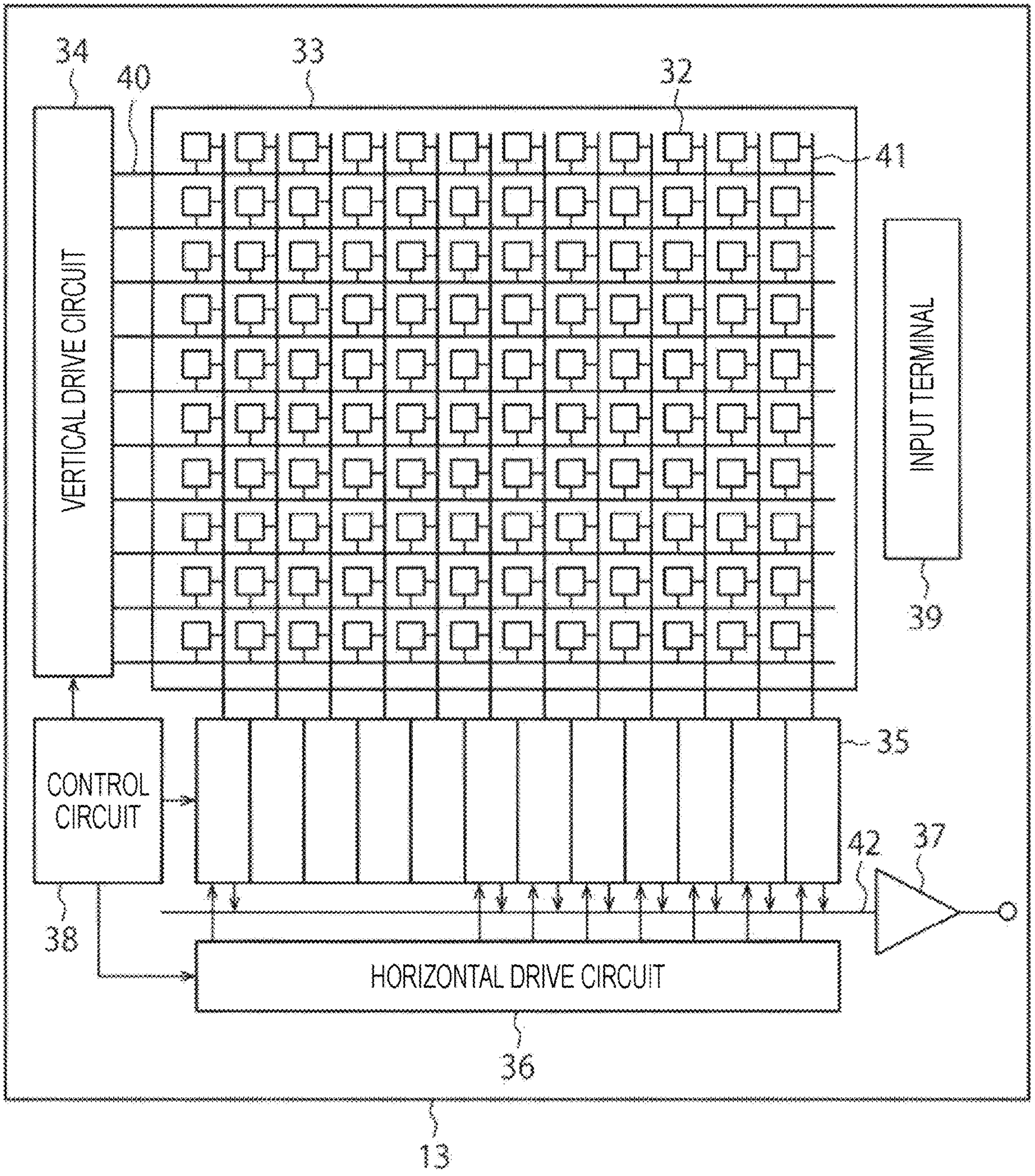
FIG. 3 is a diagram illustrating a circuit configuration example of a multi-layer substrate.

FIG. 3 illustrates a circuit configuration example of the multi-layer substrate 13.

The multi-layer substrate 13 includes a pixel array unit 33 in which pixels 32 are arranged in a two-dimensional array, a vertical drive circuit 34, a column signal processing circuit 35, a horizontal drive circuit 36, an output circuit 37, a control circuit 38, an input/output terminal 39, and the like.

The pixel 32 includes a photodiode as a photoelectric conversion element and a plurality of pixel transistors. An example of a circuit configuration of the pixel 32 will be described later with reference to FIG. 4.

Furthermore, the pixel 32 may have a shared pixel structure. This shared pixel structure includes a plurality of photodiodes, a plurality of transfer transistors, one shared floating diffusion (floating diffusion region), and another each one of shared pixel transistors. That is, in the shared pixels, the photodiodes and the transfer transistors that constitute a plurality of unit pixels share one each of the other pixel transistors.

The control circuit 38 receives an input clock and data giving a command of an operation mode and the like and outputs data of internal information and the like of the multi-layer substrate 13. That is, the control circuit 38 generates a clock signal and a control signal which serve as a reference for operation of the vertical drive circuit 34, the column signal processing circuit 35, the horizontal drive circuit 36 and the like on the basis of a vertical synchronization signal, a horizontal synchronization signal, and a master clock. Then, the control circuit 38 outputs the generated clock signal and control signal to the vertical drive circuit 34, the column signal processing circuit 35, the horizontal drive circuit 36 and the like.

The vertical drive circuit 34 includes, for example, a shift register, selects a predetermined pixel drive line 40, supplies a pulse for driving the pixels 32 to the selected pixel drive line 40, and drives the pixels 32 in units of rows. That is to say, the vertical drive circuit 34 sequentially selects to scan the pixels 32 in the pixel array unit 33 in a row unit in a vertical direction and supplies a pixel signal based on a signal charge generated according to a light receiving amount by a photoelectric converting unit of each pixel 32 to the column signal processing circuit 35 through a vertical signal line 41.

The column signal processing circuit 35 arranged for each column of the pixels 32 performs signal processing such as noise removal on the signals output from the pixels 32 of one column for each pixel column. For example, the column signal processing circuit 35 performs signal processing such as correlated double sampling (CDS) for removing pixel-specific fixed pattern noise, or AD conversion.

The horizontal drive circuit 36 including a shift register, for example, sequentially selects the column signal processing circuits 35 by sequentially outputting horizontal scanning pulses and outputs the pixel signal from each of the column signal processing circuits 35 to a horizontal signal line 42.

The output circuit 37 performs the signal processing on the signals sequentially supplied from each of the column signal processing circuits 35 through the horizontal signal line 42 to output. There is a case in which the output circuit 37 merely buffers, for example, or a case in which this performs black level adjustment, column variation correction, various types of digital signal processing and the like. An input-output terminal 39 exchanges signals with the outside.

The multi-layer substrate 13 configured as described above is a CMOS image sensor called a column AD method in which the column signal processing circuits 35 that perform CDS processing and AD conversion processing are arranged for each pixel column.

<Circuit Configuration Example of Pixel]

Figure 4:
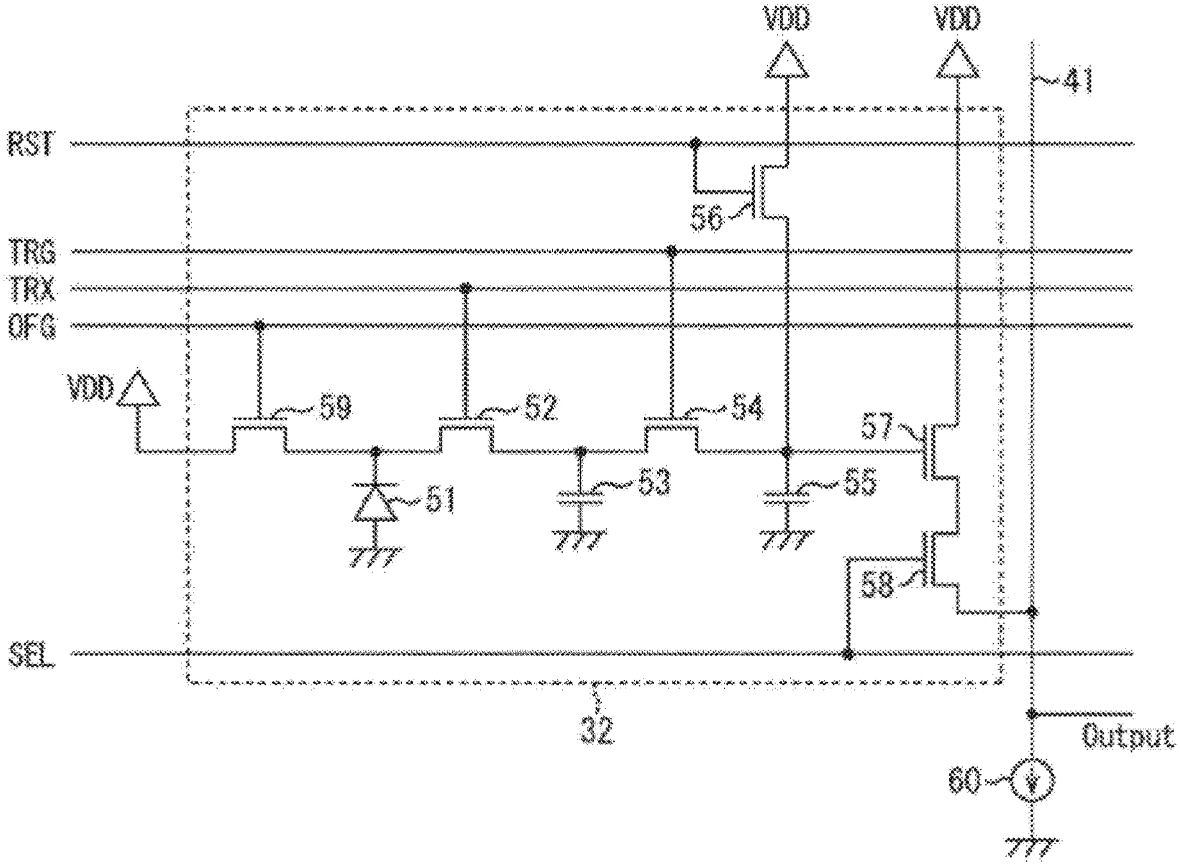
FIG. 4 is a diagram illustrating an equivalent circuit of a pixel.

FIG. 4 illustrates an equivalent circuit of the pixel 32.

The pixel 32 illustrated in FIG. 4 illustrates a configuration that implements an electronic global shutter function.

The pixel 32 includes a photodiode 51 as a photoelectric conversion element, a first transfer transistor 52, a memory unit (MEM) 53, a second transfer transistor 54, a floating diffusion region (FD) 55, a reset transistor 56, an amplification transistor 57, a selection transistor 58, and a discharge transistor 59.

The photodiode 51 is a photoelectric converting unit that generates and accumulates a charge (signal charge) corresponding to the received light amount. An anode terminal of the photodiode 51 is grounded, and a cathode terminal of the photodiode 51 is connected to the memory unit 53 via the first transfer transistor 52. Furthermore, the cathode terminal of the photodiode 51 is also connected to the discharge transistor 59 for discharging unnecessary charges.

When turned on by a transfer signal TRX, the first transfer transistor 52 reads an electric charge generated by the photodiode 51 and transfers the electric charge to the memory unit 53. The memory unit 53 is a charge holding unit that temporarily holds a charge until the charge is transferred to the FD 55.

When turned on by the transfer signal TRG, the second transfer transistor 54 reads the charge held in the memory unit 53 and transfers the charge to the FD 55.

The FD 55 is a charge holding unit that holds the electric charge read from the memory unit 53 in order to read the electric charge as a signal. When turned on by a reset signal RST, the reset transistor 56 resets the potential of the FD 55 by discharging the charge accumulated in the FD 55 to the constant voltage source VDD.

The amplification transistor 57 outputs a pixel signal corresponding to an electric potential of the FD 55. That is, the amplification transistor 57 constitutes a source follower circuit with a load MOS 60 as a constant current source, and a pixel signal indicating a level according to the charge accumulated in the FD 55 is output from the amplification transistor 57 to the column signal processing circuit 35 (FIG. 3) via the selection transistor 58. The load MOS 60 is disposed, for example, in the column signal processing circuit 35.

The selection transistor 58 is turned on when the pixel 32 is selected by a selection signal SEL, and outputs a pixel signal of the pixel 32 to the column signal processing circuit 35 via the vertical signal line 41.

When turned on by a discharge signal OFG, the discharge transistor 59 discharges unnecessary electric charge accumulated in the photodiode 51 to the constant voltage source VDD.

The transfer signals TRX and TRG, the reset signal RST, the discharge signal OFG, and the selection signal SEL are supplied from the vertical drive circuit 34 via the pixel drive line 40.

The operation of the pixel 32 will be briefly described.

First, before exposure is started, the discharge transistor 59 is turned on by supplying the discharge signal OFG at the high level to the discharge transistor 59, the charge accumulated in the photodiode 51 is discharged to the constant voltage source VDD, and the photodiodes 51 of all the pixels are reset.

After the photodiode 51 is reset, when the discharge transistor 59 is turned off by the low-level discharge signal OFG, exposure is started in all the pixels of the pixel array unit 33.

When a predetermined exposure time has elapsed, the first transfer transistor 52 is turned on by the transfer signal TRX in all the pixels of the pixel array unit 33, and the charge accumulated in the photodiode 51 is transferred to the memory unit 53.

After the first transfer transistor 52 is turned off, the charges held in the memory unit 53 of each pixel 32 are sequentially read out to the column signal processing circuit 35 in units of rows. In the read operation, the second transfer transistor 54 of the pixel 32 of the read row is turned on by the transfer signal TRG, and the charge held in the memory unit 53 is transferred to the FD 55. Then, when the selection transistor 58 is turned on by the selection signal SEL, a signal indicating a level corresponding to the charge accumulated in the FD 55 is output from the amplification transistor 57 to the column signal processing circuit 35 via the selection transistor 58.

As described above, in the pixel 32 having the pixel circuit in FIG. 4, the exposure time is set to be the same in all the pixels of the pixel array unit 33, and after the exposure is finished, the charge is temporarily held in the memory unit 53, and the global shutter system operation (imaging) of sequentially reading the charge from the memory unit 53 in units of rows is possible.

Note that the circuit configuration of the pixel 32 is not limited to the configuration illustrated in FIG. 4, and for example, a circuit configuration that does not include the memory unit 53 and performs an operation by a so-called rolling shutter system can be adopted.

<Basic Structure Example of Solid-State Imaging Device>

Figure 5:
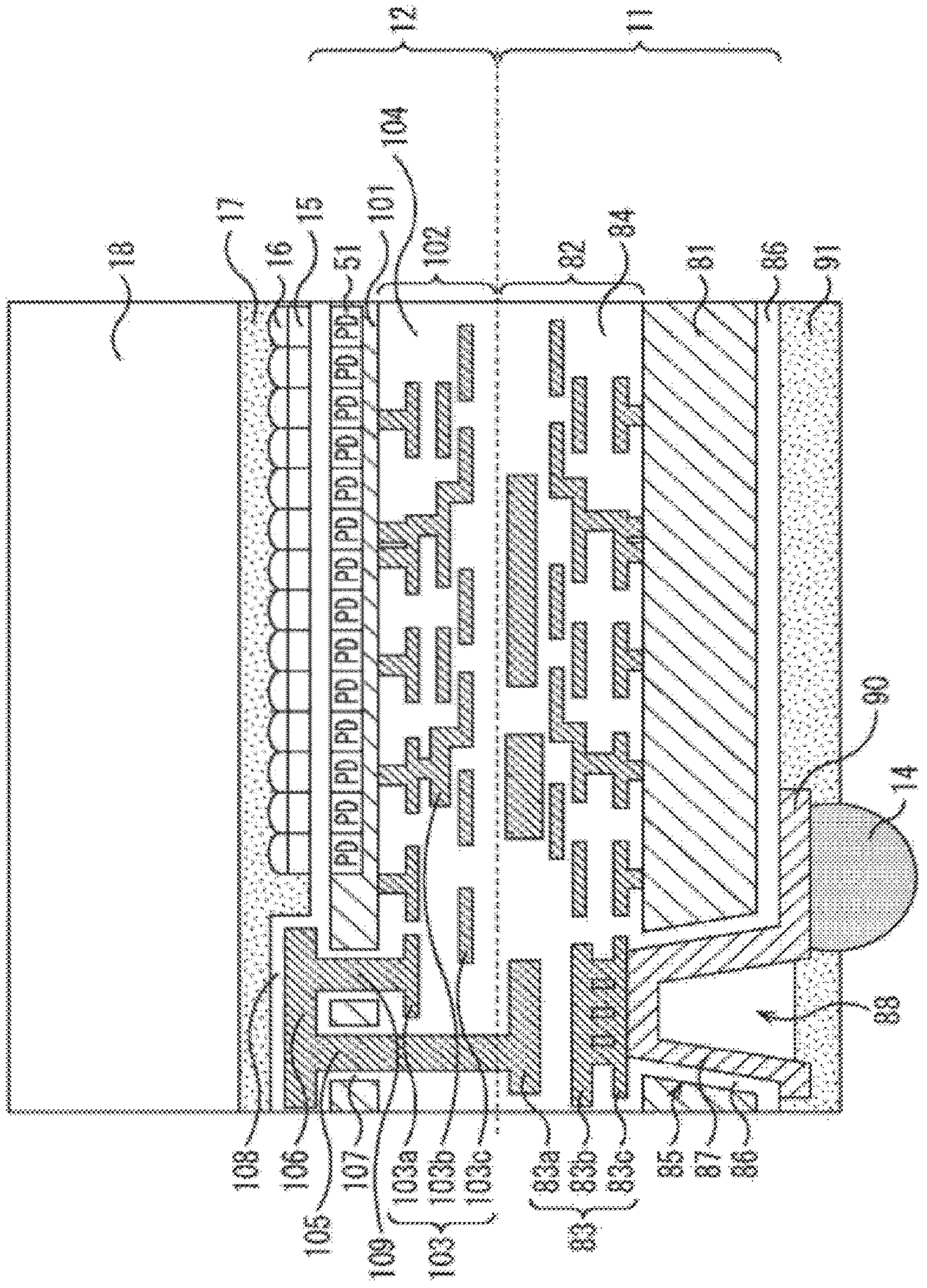
FIG. 5 is a cross-sectional view illustrating a detailed structure of the solid-state imaging device.

Next, the multi-layer substrate 13 will be described with reference to FIG. 5. FIG. 5 is an enlarged cross-sectional view illustrating a part of the solid-state imaging device 1.

In the logic substrate 11, a multilayer wiring layer 82 is formed on the upper side (pixel sensor substrate 12 side) of a semiconductor substrate 81 (hereinafter, referred to as a silicon substrate 81) constituted by, for example, silicon (Si). The multilayer wiring layer 82 constitutes the control circuit 22 and the logic circuit 23 in FIGS. 2A and 2B. Note that the multilayer wiring layer 82 constitutes the control circuit 22 and the logic circuit 23 in FIGS. 2A and 2B, but the present disclosure is not limited thereto. For example, a memory circuit and an interposer may be configured in the multilayer wiring layer 82. Alternatively, the memory circuit, the control circuit 22, and the logic circuit 23 may be combined. Furthermore, a memory circuit may be stacked on or under the control circuit 22 and the logic circuit 23. Furthermore, the multilayer wiring layer 82 may include an ADC and a DAC circuit. Alternatively, an integrated circuit such as a data converter chip may be included. Note that the silicon substrate 81 according to the present embodiment corresponds to the first substrate.

The multilayer wiring layer 82 includes a plurality of wiring layers 83 including an uppermost wiring layer 83*a* closest to the pixel sensor substrate 12, an intermediate wiring layer 83*b*, a lowermost wiring layer 83*c* closest to the silicon substrate 81, and the like, and an inter-layer insulating film 84 formed between the wiring layers 83.

The plurality of wiring layers 83 is formed using, for example, copper (Cu), aluminum (Al), tungsten (W), or the like, and the inter-layer insulating film 84 is formed using, for example, a silicon oxide film, a silicon nitride film, or the like. In each of the plurality of wiring layers 83 and the inter-layer insulating film 84, all the layers may include the same material, or two or more materials may be used depending on the layer.

A silicon through hole 85 penetrating the silicon substrate 81 is formed at a predetermined position of the silicon substrate 81, and a connection conductor 87 is embedded in an inner wall of the silicon through hole 85 via an insulating film 86 to form a through silicon via (TSV) 88. Note that, in the following description, the through silicon via 88 may be simply referred to as a through electrode 88.

The insulating film 86 has a first film and a second film. The second film is formed on the inner wall of the silicon through hole 85 via the first film. The first film can include, for example, a silicon nitride (SiN) film, a silicon oxynitride (SiOxNy) film, a titanium nitride (TiN) film, or the like. Furthermore, the second film can include, for example, a silicon dioxide ($SiO_2$) film, a silicon nitride (SiN) film, or the like. Note that details of the insulating film 86 will be described later.

As illustrated in FIG. 5, the silicon through hole 85 can have a tapered shape as illustrated in FIG. 5. For example, it may have a tapered shape in which the diameter decreases in the irradiation direction of the exposure in the exposure processing. That is, the tapered shape of the silicon through hole 85 can be configured such that the opening diameter on the surface side of the silicon substrate 81 opposite to the multilayer wiring layer 82 is large and the opening diameter on the multilayer wiring layer 82 side is small. Alternatively, a rectangular shape as described later can be used.

Note that, in the through silicon via 88 illustrated in FIG. 5, the insulating film 86 and the connection conductor 87 are formed along the inner wall surface, and the inside of the silicon through hole 85 is hollow. However, depending on the inner diameter, the entire inside of the silicon through hole 85 may be filled with the connection conductor 87. In other words, the inside of the through hole may be filled with a conductor, or a part of the through hole may be a cavity. The same applies to a through chip via (TCV) 105 and the like as described later.

The connection conductor 87 of the through silicon via 88 is connected to the redistribution layer 90 formed on the lower surface side of the silicon substrate 81, and the redistribution layer 90 is connected to the solder ball 14. The connection conductor 87 and the redistribution layer 90 can be formed by, for example, copper (Cu), tungsten (W), titanium (Ti), tantalum (Ta), titanium tungsten alloy (TiW), polysilicon, or the like. Note that the connection conductor 87 according to the present embodiment corresponds to the first connection conductor, and the redistribution layer 90 corresponds to the second connection conductor.

Furthermore, on the lower surface side of the silicon substrate 81, a solder mask (solder resist) 91 is formed so as to cover the redistribution layer 90 and the insulating film 86 except for the region where the solder balls 14 are formed.

On the other hand, in the pixel sensor substrate 12, a multilayer wiring layer 102 is formed on the lower side (logic substrate 11 side) of a semiconductor substrate 101 (hereinafter, referred to as a silicon substrate 101) constituted by, for example, silicon (Si). The multilayer wiring layer 102 constitutes the pixel circuit of the pixel region 21 in FIGS. 2A and 2B.

The multilayer wiring layer 102 includes a plurality of wiring layers 103 including an uppermost wiring layer 103*a* closest to the silicon substrate 101, an intermediate wiring layer 103*b*, a lowermost wiring layer 103*c* closest to the logic substrate 11, and the like, and an inter-layer insulating film 104 formed between the wiring layers 103.

As the material used as the plurality of wiring layers 103 and the inter-layer insulating film 104, the same type of material as the material of the wiring layer 83 and the inter-layer insulating film 84 described above can be adopted. Furthermore, the plurality of wiring layers 103 and the inter-layer insulating film 104 may be formed by using one or two or more materials, which is similar to the wiring layer 83 and the inter-layer insulating film 84 described above.

Note that, in the example of FIG. 5, the multilayer wiring layer 102 of the pixel sensor substrate 12 includes the three wiring layers 103, and the multilayer wiring layer 82 of the logic substrate 11 includes the four wiring layers 83. However, the total number of wiring layers is not limited thereto, and any number of wiring layers can be formed.

In the silicon substrate 101, a photodiode 51 formed by a PN junction is formed for each pixel 32.

Furthermore, although not illustrated, a plurality of pixel transistors such as the first transfer transistor 52 and the second transfer transistor 54, a memory unit (MEM) 53, and the like are also formed in the multilayer wiring layer 102 and the silicon substrate 101.

At a predetermined position of the silicon substrate 101 where the color filter 15 and the on-chip lens 16 are not formed, a through silicon via 109 connected to the wiring layer 103*a* of the pixel sensor substrate 12 and a through chip via 105 connected to the wiring layer 83*a* of the logic substrate 11 are formed.

The through chip via 105 and the through silicon via 109 are connected by a connection wiring 106 formed on the upper surface of the silicon substrate 101. Furthermore, an insulating film 107 is formed between each of the through silicon via 109 and the through chip via 105 and the silicon substrate 101. Moreover, on the upper surface of the silicon substrate 101, a color filter 15 and an on-chip lens 16 are formed via an insulating film (planarization film) 108.

As described above, the multi-layer substrate 13 of the solid-state imaging device 1 illustrated in FIG. 1 has a stacked structure in which the multilayer wiring layer 82 side of the logic substrate 11 and the multilayer wiring layer 102 side of the pixel sensor substrate 12 are bonded together. In FIG. 5, a bonding surface between the multilayer wiring layer 82 of the logic substrate 11 and the multilayer wiring layer 102 of the pixel sensor substrate 12 is indicated by a broken line.

Furthermore, in the multi-layer substrate 13 of the solid-state imaging device 1, the wiring layer 103 of the pixel sensor substrate 12 and the wiring layer 83 of the logic substrate 11 are connected by two through electrodes of the through silicon via 109 and the through chip via 105, and the wiring layer 83 of the logic substrate 11 and the solder ball (back electrode) 14 are connected by the through silicon via 88 and the redistribution layer 90. As a result, the plane area of the solid-state imaging device 1 can be minimized.

Moreover, the height direction can also be lowered by forming the space between the multi-layer substrate 13 and the glass protection substrate 18 into a cavity-less structure and bonding them with the glass seal resin 17.

Therefore, according to the solid-state imaging device 1 illustrated in FIG. 1, a semiconductor device (semiconductor package) that is further downsized can be achieved.

Figure 6:
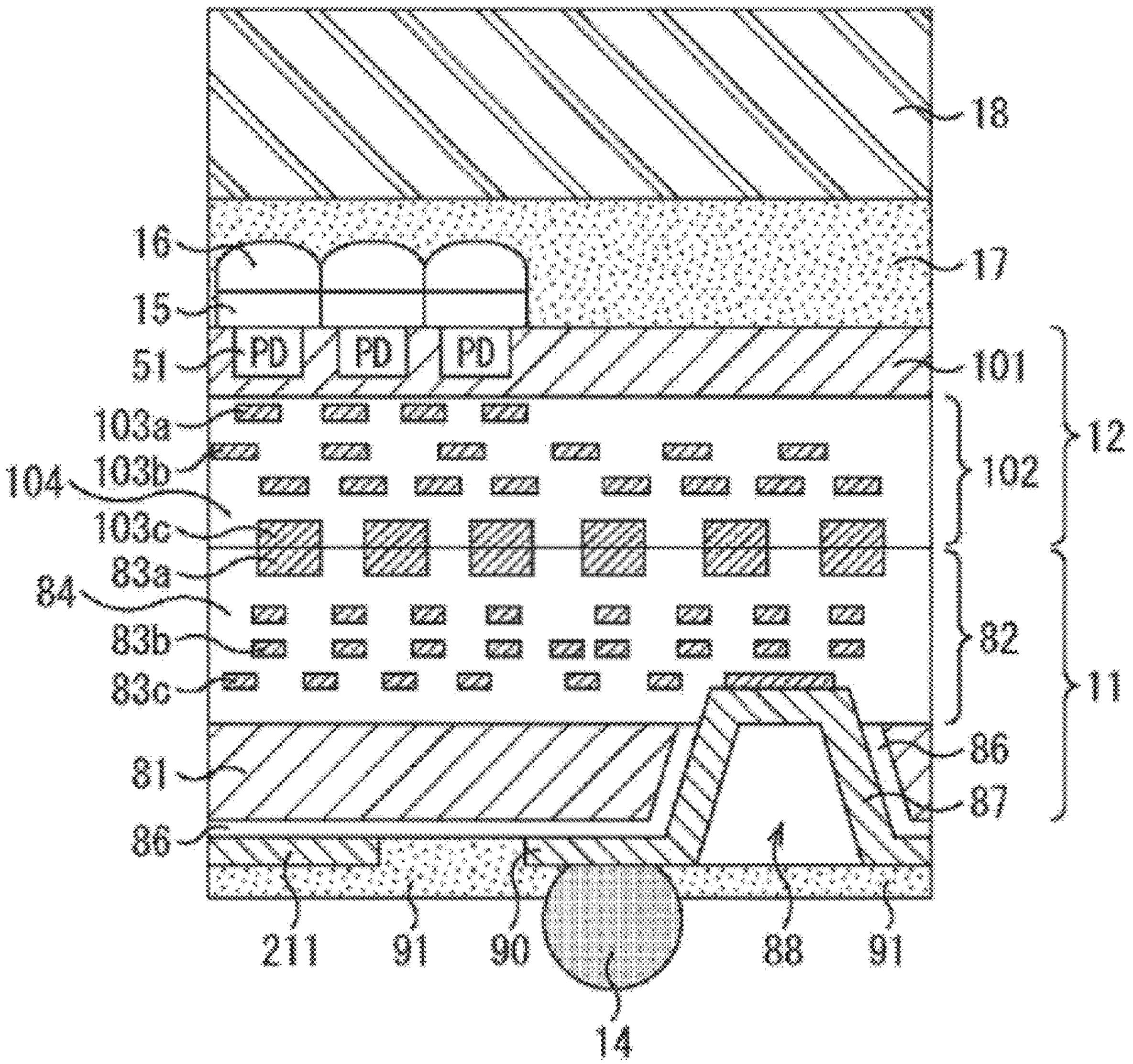
FIG. 6 is a diagram illustrating a modification of the multi-layer substrate.

FIG. 6 is a diagram illustrating a modification of the multi-layer substrate 13 of the solid-state imaging device 1. In FIG. 6, a connection method between the logic substrate 11 and the pixel sensor substrate 12 is different from the basic structure of FIG. 5.

That is, in the basic structure of FIG. 5, the logic substrate 11 and the pixel sensor substrate 12 are connected by using two through electrodes of the through silicon via 109 and the through chip via 105. On the other hand, in the ninth modification, the logic substrate 11 and the pixel sensor substrate 12 are connected by metal bonding (Cu—Cu bonding) between the uppermost wiring layer 83*a* in the multilayer wiring layer 82 of the logic substrate 11 and the lowermost wiring layer 103*c* in the multilayer wiring layer 102 of the pixel sensor substrate 12.

In FIG. 6, a connection method with the solder ball 14 on the lower side of the solid-state imaging device 1 is similar to the basic structure of FIG. 5. That is, the through silicon via 88 is connected to the lowermost wiring layer 83*c* of the logic substrate 11, and thereby, the solder ball 14 is connected to the wiring layer 83 and the wiring layer 103 in the multi-layer substrate 13.

On the other hand, FIG. 6 is different from the basic structure of FIG. 5 in that dummy wiring 211 that is not electrically connected anywhere is formed on the lower surface side of the silicon substrate 81 in the same layer as the redistribution layer 90 to which the solder ball 14 is connected, using the same wiring material as the redistribution layer 90.

The dummy wiring 211 is for reducing the influence of unevenness at the time of metal bonding (Cu—Cu bonding) between the uppermost wiring layer 83*a* on the logic substrate 11 side and the lowermost wiring layer 103*c* on the pixel sensor substrate 12 side. That is, when the Cu—Cu bonding is performed, if the redistribution layer 90 is formed only in a partial region of the lower surface of the silicon substrate 81, unevenness occurs due to a difference in thickness due to the presence or absence of the redistribution layer 90. Therefore, by providing the dummy wiring 211, the influence of the unevenness can be reduced.

Figure 7:
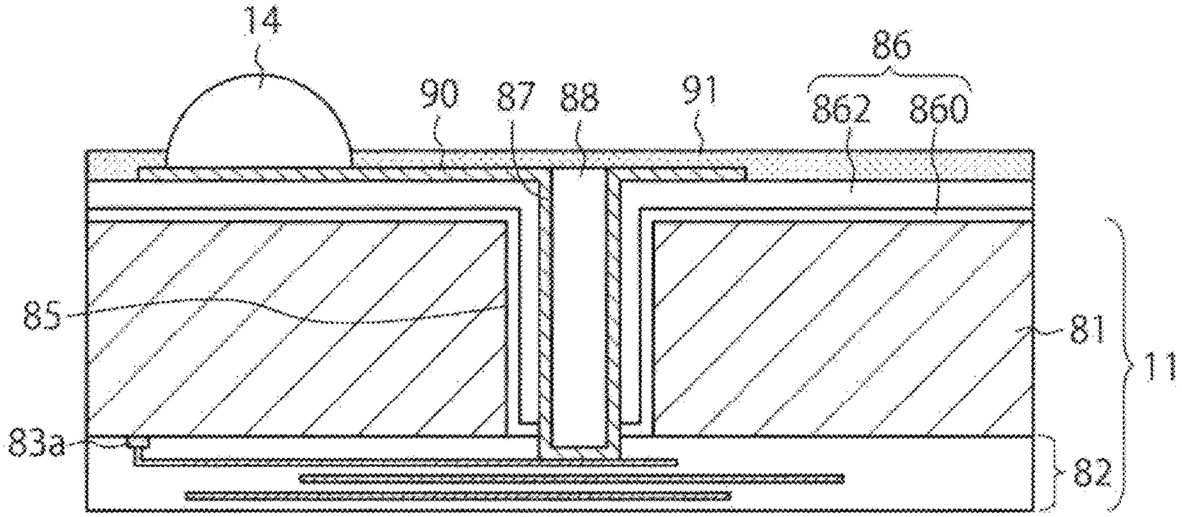
FIG. 7 is a diagram illustrating a configuration example of a through electrode formed on a lower substrate.

FIG. 7 is a diagram illustrating a configuration example of the through electrode 88 formed on a lower substrate 11. As illustrated in FIG. 7, the lower substrate 11 side is illustrated on the upper side, and the illustration of the upper substrate 12 is omitted. The shape of the through silicon through hole 85 formed in the lower substrate 11 of the solid-state imaging device 1 according to FIGS. 5 and 6 is tapered, but is different from the solid-state imaging device 1 according to FIGS. 5 and 6 in that the shape of the through silicon through hole 85 formed in the lower substrate 11 of the solid-state imaging device 1 illustrated in FIG. 7 is rectangular. The semiconductor element 83*a* is connected to the wiring. The opening of the silicon through hole 85 is, for example, circular.

The insulating film 86 has a first film 860 and a second film 862. The thickness of the first film 860 may vary depending on the position where the first film 860 is formed. For example, the thickness of the first film 860 on the plane may be configured to be thicker than the thickness of the first film 860 on the vertical plane. The light absorption characteristics or reflection characteristics of first film 860 can be adjusted by the thickness and material of first film 860.

Figure 8:
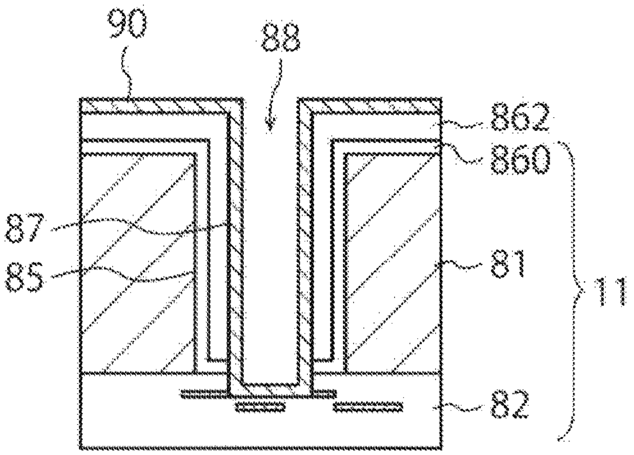
FIG. 8 is a diagram illustrating the through electrode of FIG. 7.

FIG. 8 is a diagram illustrating the through electrode 88 of FIG. 7. As illustrated in FIG. 8, the silicon through hole 85, which is a hole-shaped portion, penetrates the multilayer wiring layer 82 from one surface of the silicon substrate 81. The first film 860 is formed on the inner surface of the silicon through hole 85 formed in the silicon substrate 81 by, for example, a chemical vapor deposition method (CVD). The first film 860 is an insulating film and includes a material of, for example, silicon nitride (SiN), silicon oxynitride (SiOxNy), titanium nitride (TiN), or the like.

The second film 862 is a film that covers the side surface of the hole-shaped portion with the first film 860 interposed therebetween. The second film 862 is a photosensitive insulating film. The second film 862 is, for example, an insulating resin film, and may include at least one of polyimide, silicone, acrylic, epoxy, or spin-on carbon (SOC). For example, a polyimide film is formed by spin coating. Furthermore, as illustrated in FIG. 8, the second film 862 is also formed on the surface of the silicon substrate 81 on which the ball (back electrode) 14 is formed via the first film 860.

The first film 860 can enhance adhesion between the silicon (Si) layer of the silicon substrate 81 and the second film 862. This makes it possible to suppress peeling of the second film 862 from the silicon substrate 81. In other words, a material capable of enhancing adhesion between the silicon (Si) layer of the silicon substrate 81 and the second film 862 can be used for the first film 860.

Furthermore, the first film 860 can prevent reflection between the silicon (Si) layer of the silicon substrate 81 and the second film 862. For example, as will be described later, wavelength light of 300 to 450 nanometers that sensitizes the second film 862 is absorbed.

Figure 9A:
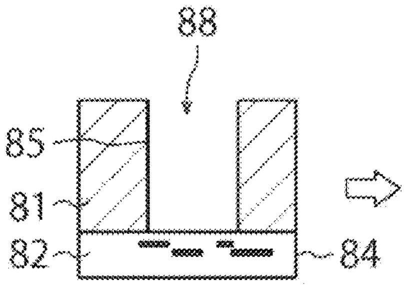
FIGS. 9A, 9B, 9C, 9D, 9E, and 9F are diagrams illustrating a manufacturing process example of the through electrode.

FIGS. 9A, 9B, 9C, 9D, 9E, and 9F are diagrams illustrating a manufacturing process example of the through electrode 88 illustrated in FIG. 8. First, as illustrated in FIG. 9A of the drawing, the silicon through hole 85 is formed in the silicon substrate 81 by, for example, etching. The silicon through hole 85 penetrates the silicon substrate 81 and reaches the multilayer wiring layer 82.

Figure 9B:
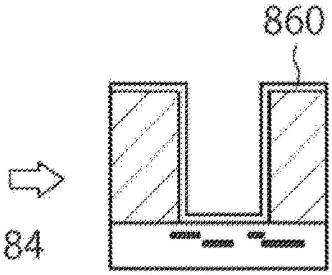

Next, as illustrated in the drawing FIG. 9B, the first film 860 (ARL: antireflection film) is stacked on the silicon through hole 85. Next, as illustrated in the drawing FIG. 9C, a photosensitive insulating resin material 862*a* is embedded in the through hole while securing a desired film thickness on the surface of the semiconductor substrate using a coating technique. As the coating method, a spin coating method, a lamination method, or the like can be used. For example, in the vacuum laminator, it is possible to perform lamination on a table at a predetermined temperature using a sticking roll at a predetermined pressure in a vacuum chamber at a predetermined degree of vacuum. Note that, by using the photosensitive insulating resin material 862*a*, the film thickness of the photosensitive insulating resin material 862*a* can be increased in a shorter time.

Subsequently, exposure processing is performed on the photosensitive insulating resin material 862*a*. A mask 870 is disposed in a predetermined region on the photosensitive insulating resin material 862*a*. Exposure processing is performed on the photosensitive insulating resin material 862*a* through the mask 870. As the wavelength at this time, for example, wavelength light of 300 to 450 nanometers can be used. For example, an I ray having a wavelength of 365 nanometers, an h ray having a wavelength of 405 nanometers, and a g ray having a wavelength of 436 nanometers can be used. As described above, in the present embodiment, the photosensitive insulating resin material 862*a* can include a negative photosensitive resin composition.

Figure 9C:
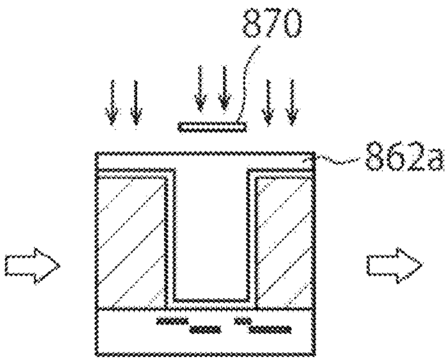
Figure 9D:
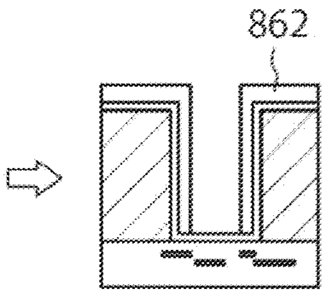

Next, as illustrated in FIG. 9D, patterning is performed using exposure and development of the lithography technology. In this case, an opening can be formed in the photosensitive insulating resin material 862*a* in the mask forming region (light shielding region that is not exposed and irradiated). As a result, the photosensitive insulating resin material 862*a* is formed as the second film 862 that is an insulating resin film on the sidewall part of the silicon layer of the through electrode 88.

Figure 9E:
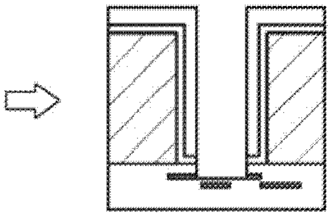
Figure 9F:
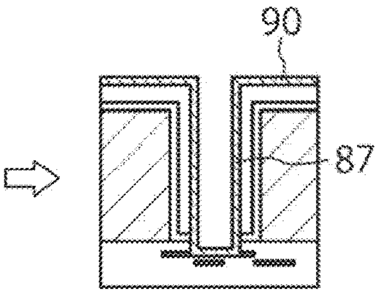

Next, as illustrated in FIG. 9E, using the second film 862 as a mask, the first film 860 and the inter-layer insulating film 84 at the bottom are etched by isotropic dry etching. In this case, etching is performed until the predetermined wiring is reached. Then, as illustrated in FIG. 9F, the connection conductor 87 and the redistribution layer 90 are deposited.

Figure 10:
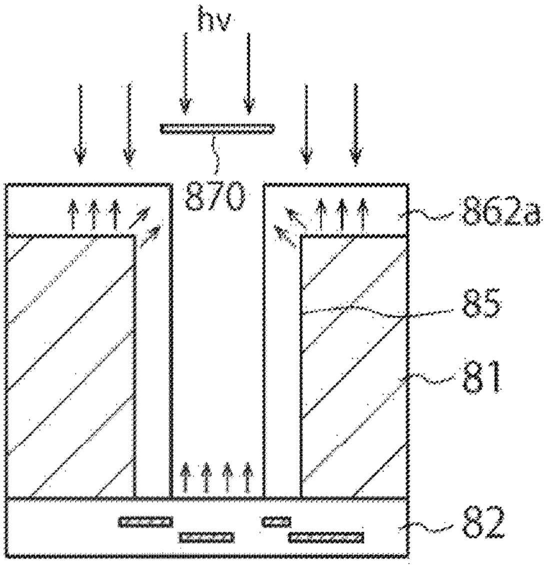
FIG. 10 is a diagram illustrating a comparative example in processing FIG. 9C.

FIG. 10 is a diagram illustrating a comparative example in processing FIG. 9C. As illustrated in FIG. 10, in a case where the exposure processing is performed in a state where the first film 860 is not stacked on the silicon through hole 85, light enters the mask region of the optical insulating resin material 862*a* due to reflection from the silicon substrate 81 and the multilayer wiring layer 82.

Figure 11A:
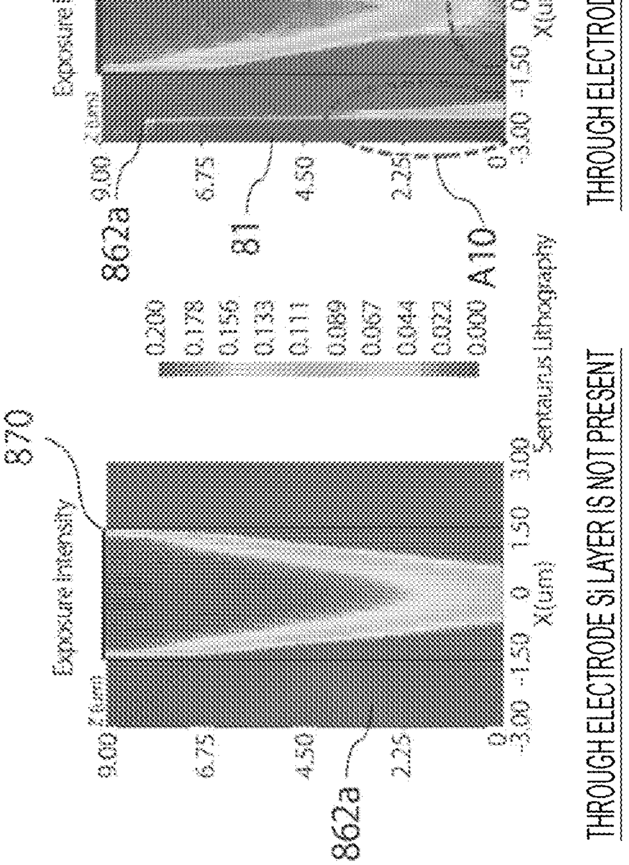
FIGS. 11A, 11B, and 11C are diagrams illustrating a light intensity distribution simulation result in a state where the first film is not stacked.
Figure 11B:
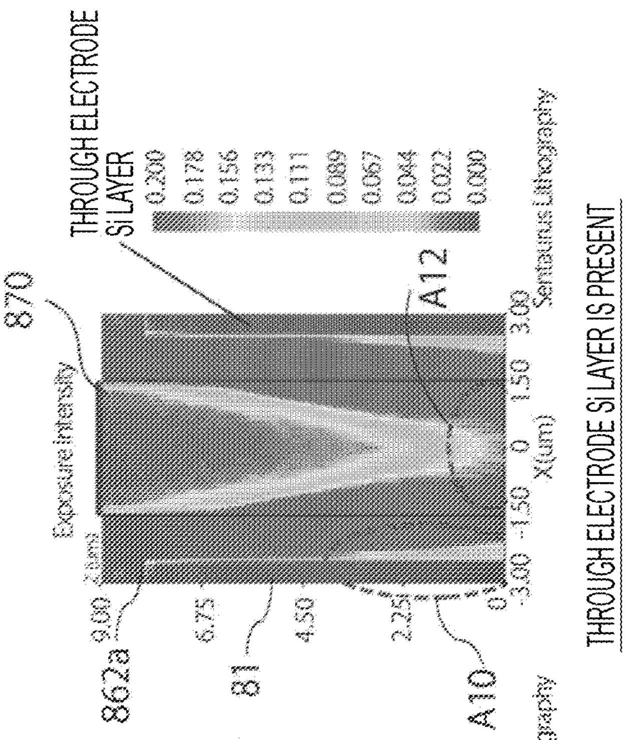
Figure 11C:
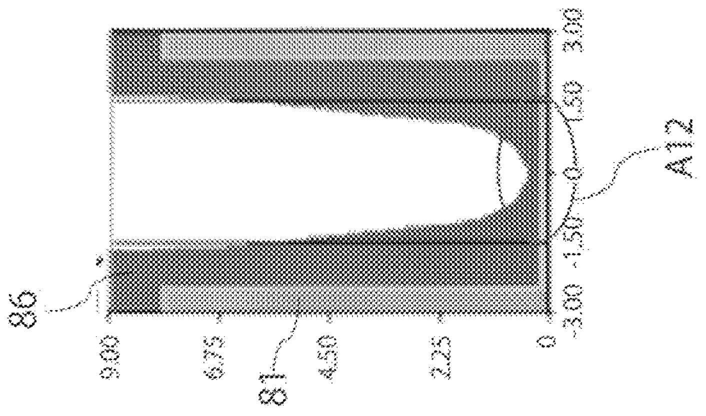

FIGS. 11A. 11B, and 11C are diagrams illustrating a light intensity distribution simulation result in the exposure processing in a state where the first film 860 is not stacked on the silicon through hole 85. FIG. 11A illustrates a state where there is no silicon substrate 81, and FIG. 11B illustrates a state where there is the silicon substrate 81. A region A10 in FIG. 11B is a region affected by reflected light by the silicon substrate 81. A region A12 indicates a region affected by reflected light by the multilayer wiring layer 82. FIG. 11C illustrates a patterning result after exposure in FIG. 11B. As illustrated in the region A12 in FIG. 11C, the optical insulating resin material 862*a* is cured due to the influence of the reflected light by the multilayer wiring layer 82, and the optical insulating resin material 862*a* in the region A12 remains at the time of patterning. As described above, in the exposure processing in a state where the first film 860 is not stacked, the patterning resolution of lithography is reduced.

Figure 12:
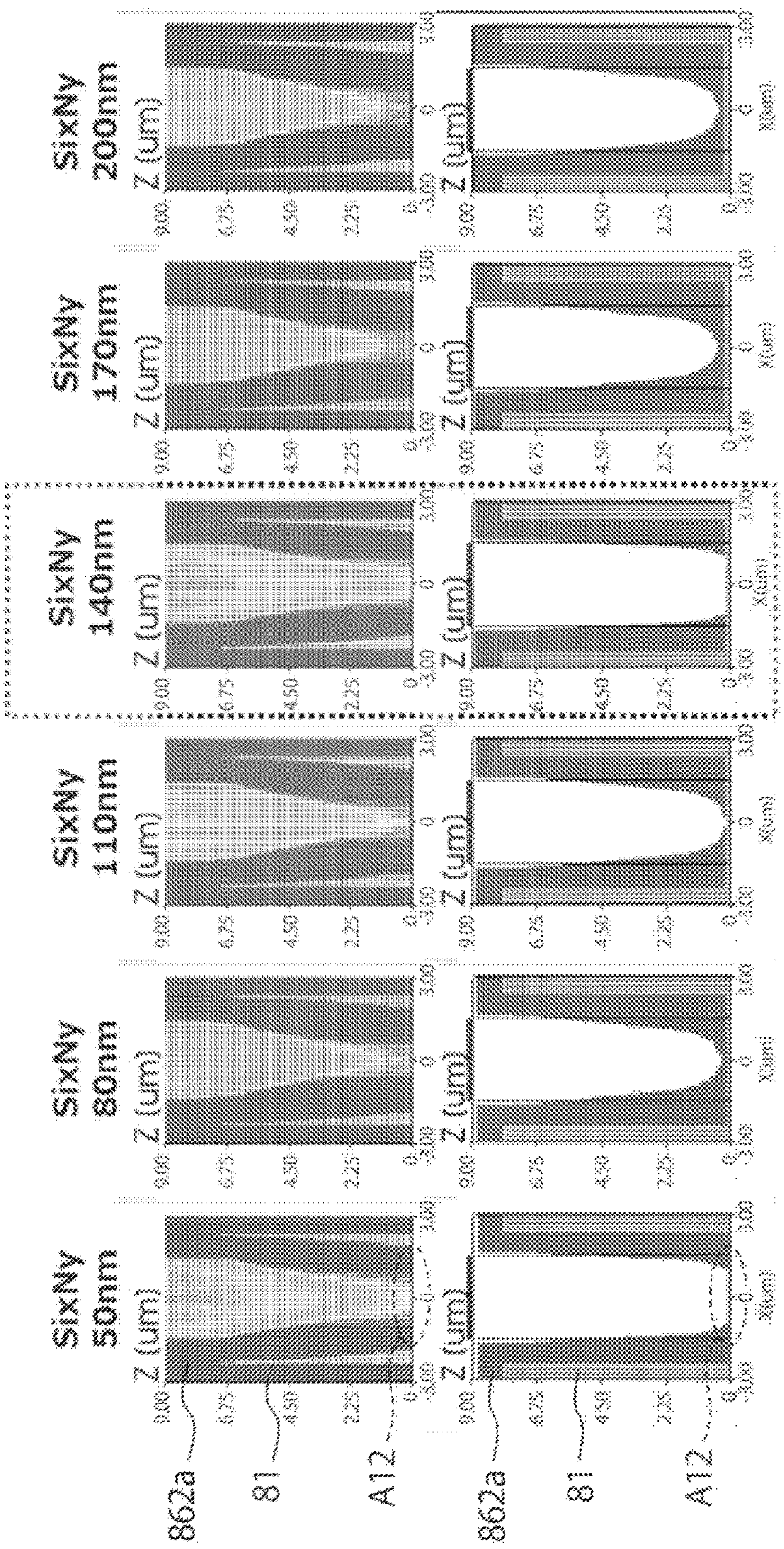
FIG. 12 is a diagram illustrating a simulation result in a case where a silicon nitride film (SixNy film) is stacked.

FIG. 12 is a diagram illustrating a simulation result in a case where a silicon nitride film (SixNy film) is stacked as the first film 860. The upper diagram is a diagram illustrating a light intensity distribution simulation result in the exposure processing, and the lower diagram is a diagram illustrating a patterning result after exposure. In this simulation example, the diameter of the silicon through hole 85 is 70 micrometers and the depth is 105 micrometers. The silicon nitride film (SixNy film) had a reflectance n of 2.0969 and a refractive index k of 0. The film thicknesses of the silicon nitride films were 50, 80, 110, 140, 170, and 200 nanometers, respectively, from the left.

As illustrated in the patterning result of FIG. 12, the case where the film thickness of the silicon nitride film is 140 nanometers is optimal in this simulation. On the other hand, when the film thickness of the silicon nitride film is set to 80 nanometers or 110 nanometers, which is thinner than 140 nanometers, the intensity of scattered light in the region A12 becomes stronger, and the optical insulating resin material 862*a* in the region A12 remains more. Furthermore, when the film thickness of the silicon nitride film is set to 170 nanometers or 200 nanometers, which is thicker than 140 nanometers, the intensity of scattered light in the region A12 becomes stronger, and the optical insulating resin material 862*a* in the region A12 remains more. As described above, the optimum thickness of the silicon nitride film varies depending on the shape of the silicon through hole 85 and the material of the first film 860, that is, the characteristics.

Figure 13:
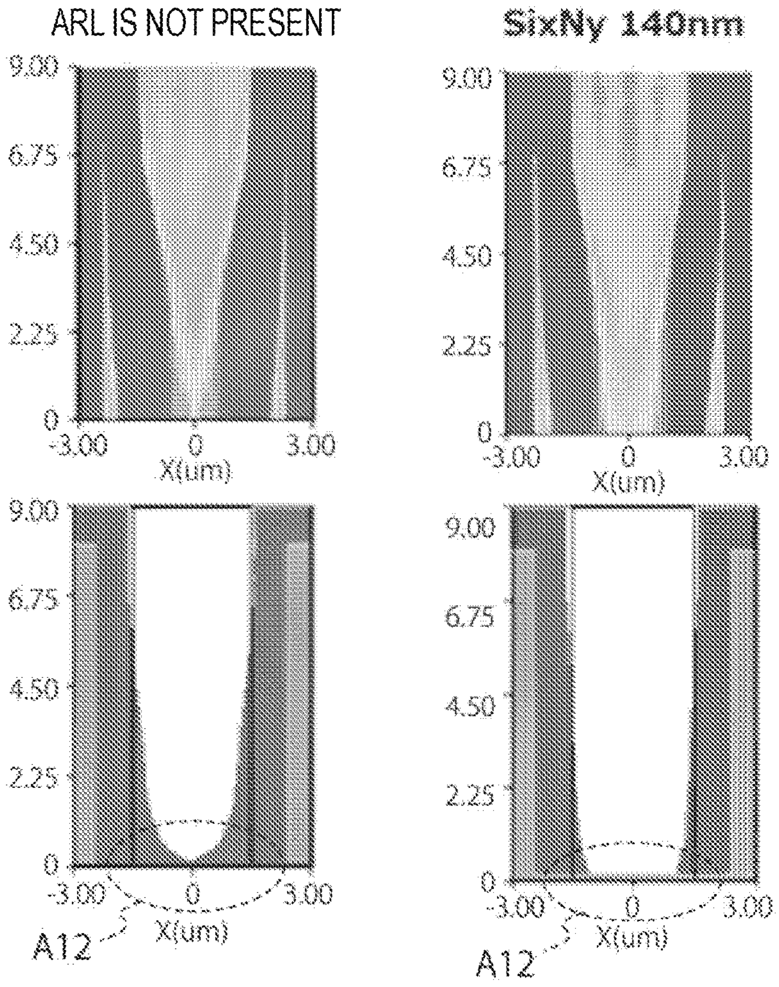
FIG. 13 is a diagram illustrating simulation results in a case where there is a silicon nitride film and in a case where there is no silicon nitride film.

FIG. 13 is a diagram illustrating a simulation result in a case where the film thickness of the silicon nitride film of FIG. 12 is 140 nanometers and a simulation result in a case where there is no silicon nitride film. The left drawing is a simulation result in a case where there is no silicon nitride film, and the right drawing is a simulation result in a case where a silicon nitride film is stacked as the first film 860 at 140 nanometers. As described above, in a case where the film thickness of the silicon nitride film is 140 nanometers, patterning resolution of lithography is improved as compared with a case where there is no silicon nitride film.

Figure 14:
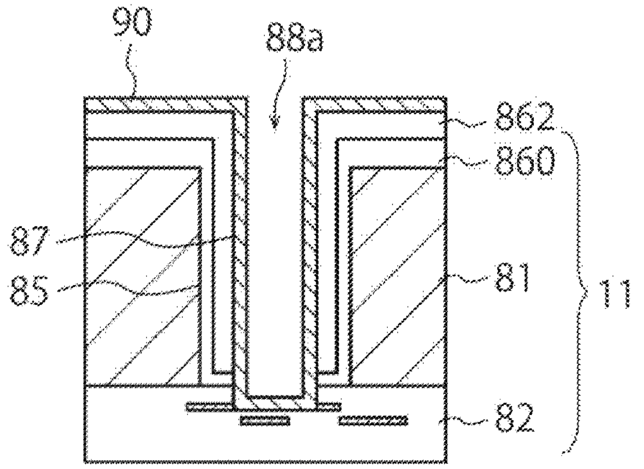
FIG. 14 is a diagram illustrating an example in which a film thickness of the first film is changed according to a position in the through electrode.

FIG. 14 is a diagram illustrating an example in which a film thickness of the first film 860 is changed according to a position in the through electrode 88*b*. As illustrated in FIG. 14, in the through electrode 88*b*, the thickness of the bottom portion of the silicon through hole 85 and the thickness of the upper surface of the silicon substrate 81 are configured to be larger than the thickness of the side wall part of the silicon through hole 85. For example, the film thickness of the first film 860 is adjusted according to the position so that the absorption of the exposure light in the silicon through hole 85 is maximized. This makes it possible to further reduce light reflected by the silicon through hole 85 and the multilayer wiring layer 82 when the photosensitive insulating resin material 862*a* is exposed.

As described above, according to the present embodiment, the first film 860 is formed on at least some surfaces of the side surfaces and the bottom surface of the silicon through hole 85 formed in the silicon substrate 81, and the photosensitive second film 862 is formed so as to cover at least a part of the side surface and the bottom surface of the silicon through hole 85 via the first film. This makes it possible to suppress peeling of the second film 862 from the silicon substrate 81. Furthermore, when the photosensitive insulating resin material 862*a* is exposed and the second film 862 is patterned, reflected light from the silicon substrate 81 and the multilayer wiring layer 82 as the bottom portion can be suppressed by the first film 860. Therefore, the patterning resolution of the second film 862 can be improved.

Second Embodiment

In the solid-state imaging device 1 according to the first embodiment, the first film 860 is connected to the connection conductor 87. On the other hand, the solid-state imaging device 1 according to the second embodiment is different in that the first film 860*a* is not connected to the connection conductor 87 and the redistribution layer 90. Hereinafter, differences from the solid-state imaging device 1 according to the first embodiment will be described.

Figure 15:
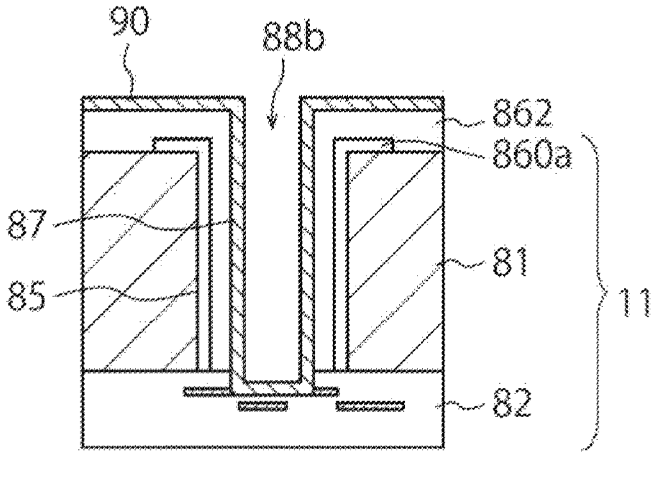
FIG. 15 is a diagram illustrating a through electrode according to a second embodiment.

FIG. 15 is a diagram illustrating a through electrode 88*b* according to the second embodiment. As illustrated in FIG. 15, in the through electrode 88*b* according to the second embodiment, the first film 860*a* is formed in a non-connected state with the connection conductor 87. More specifically, the first film 860*a* is not formed at the bottom portion of the silicon through hole 85. Furthermore, on the upper surface of the silicon substrate 81, the first film 860*a* is formed in a predetermined range in contact with the opening of the recon through hole 85. As a result, since the first film 860*a* is not connected to the connection conductor 87 and the redistribution layer 90, the first film 860*a* can be formed as either an insulating film or a conductive film.

Figures 16A, 16B, 16C:
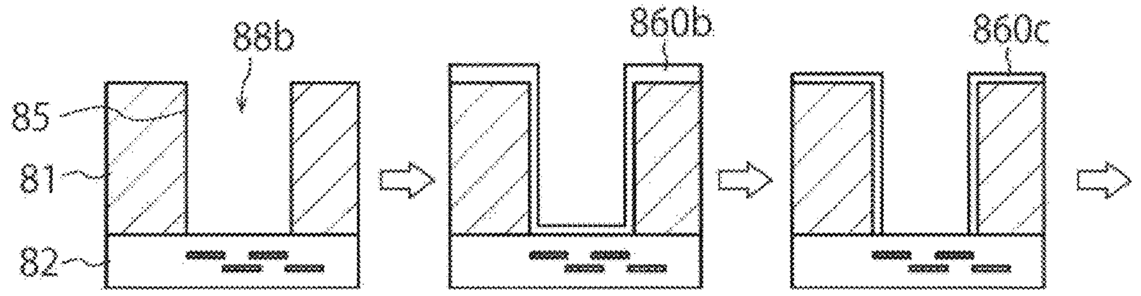
FIGS. 16A, 16B, 16C, 16D, 16E, 16F, 16G, 16H, and 16I are diagrams illustrating a manufacturing process example of the through electrode illustrated in FIG. 15.

FIGS. 16A, 16B, 16C, 16D, 16E, 16F, 16G, 16H, and 16I are diagrams illustrating a manufacturing process example of the through electrode 88*b* illustrated in FIG. 15. First, as illustrated in FIG. 16A of the drawing, the silicon through hole 85 is formed in the silicon substrate 81 by etching. The silicon through hole 85 penetrates the silicon substrate 81 and reaches the multilayer wiring layer 82.

Next, as illustrated in FIG. 16B, the first film 860*b* is stacked on the silicon through hole 85 with low coverage. That is, the film thickness of the first film 860*b* on the surface of the silicon substrate 81 is made thicker than the bottom portion of the silicon through hole 85.

Next, as illustrated in FIG. 16C, the first film 860*b* at the bottom portion is removed by isotropic dry etching. At this time, since the first film 860 on the surface of the silicon substrate 81 is formed thick with low coverage, the first film 860*c* on the surface of the silicon substrate 81 remains.

Figures 16D, 16E, 16F:
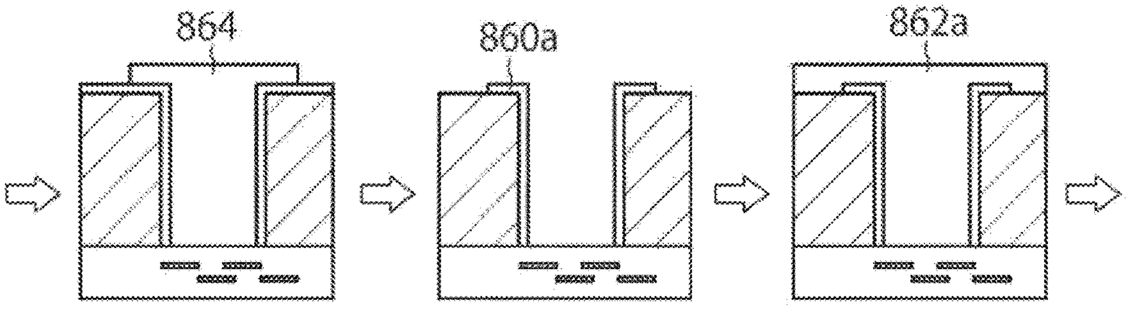
Figures 16G, 16H, 16I:
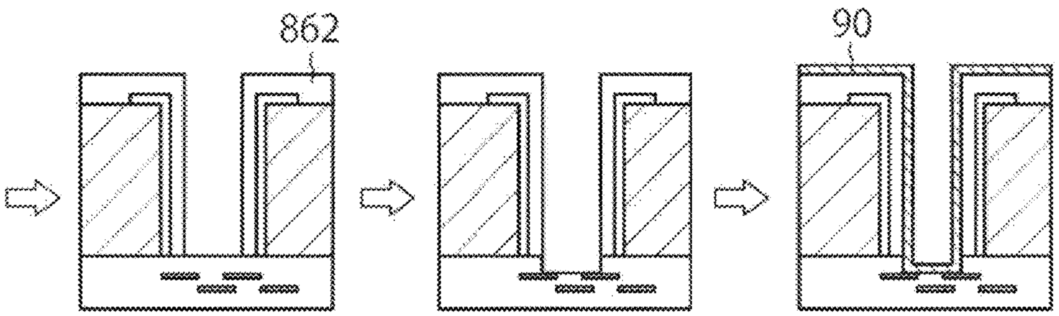

Next, as illustrated in FIG. 16D, a resist 864 is patterned such that the first film 860*a* is disposed only around the through electrode 88*b*. Next, as illustrated in FIG. 16E, unnecessary first film 860*c* is removed by isotropic dry etching to form the first film 860*a*. Furthermore, the resist 864 is removed by peeling. In FIGS. 16F, 16G, 16H, and 16I, the same processes as those in FIGS. 9C, 9D, 9E, and 9F are performed.

As described above, according to the present embodiment, the first film 860 is formed so as not to be connected to the connection conductor 87 and the redistribution layer 90. As a result, the first film 860 can be formed as either an insulating film or a conductive film.

Third Embodiment

In the solid-state imaging device 1 according to the second embodiment, the first film 860*a* is formed in a predetermined range in contact with the opening of the licon through hole 85 on the upper surface of the silicon substrate 81. On the other hand, in the solid-state imaging device 1 according to a third embodiment, the first film 860*c* is formed in the entire upper surface of the silicon substrate 81. Hereinafter, differences from the solid-state imaging device 1 according to the second embodiment will be described.

Figure 17:
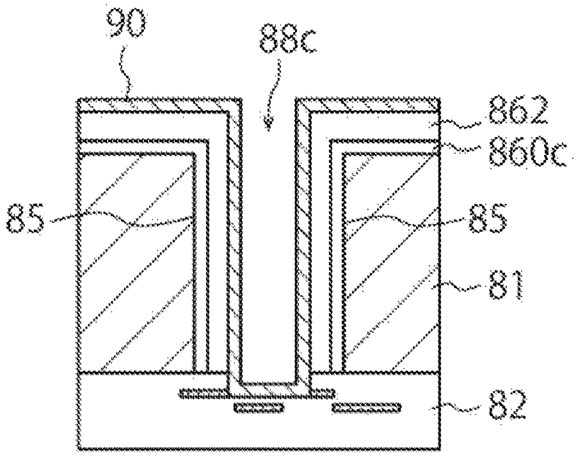
FIG. 17 is a diagram illustrating a through electrode according to a third embodiment.
Figure 18A:
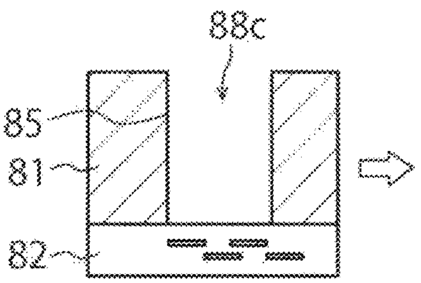
FIGS. 18A, 18B. 18C, 18D, 18E, 18F, and 18G are diagrams illustrating a manufacturing process example of the through electrode illustrated in FIG. 17.
Figure 18B:
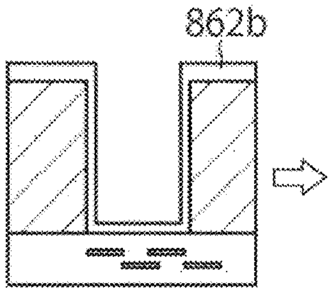
Figure 18C:
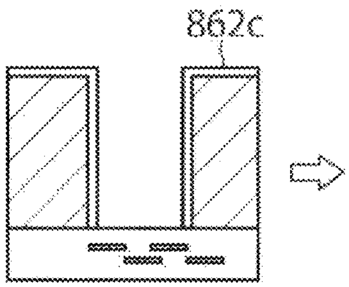
Figure 18D:
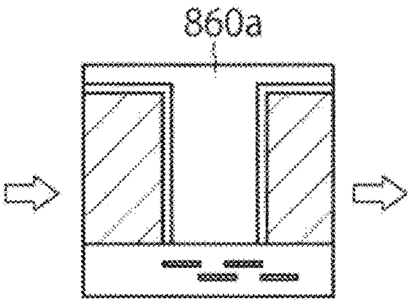
Figure 18E:
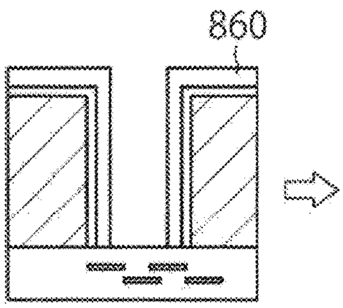
Figure 18F:
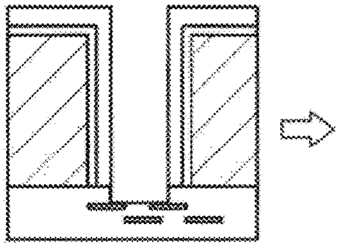
Figure 18G:
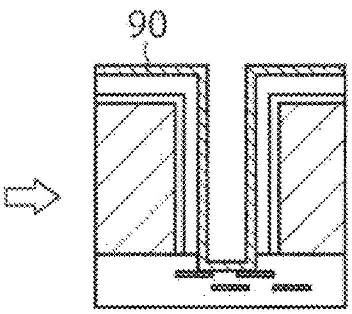

FIG. 17 is a diagram illustrating a through electrode 88*c* according to the third embodiment. As illustrated in FIG. 17, in the through electrode 88*c* according to the third embodiment, the first film 860*d* is formed over the entire upper surface of the silicon substrate 81.

FIGS. 18A, 18B, 18C, 18D, 18E, 18F, and 18G are diagrams illustrating a manufacturing process example of the through electrode 88*c* illustrated in FIG. 17. As illustrated in FIGS. 18A, 18B, 18C, 18D, 18E, 18F, and 18G, the through electrode 88*c* is generated by excluding the processes in FIGS. 16D and 16E.

As described above, according to the present embodiment, the first film 860*c* is formed over the entire upper surface of the silicon substrate 81, and the first film 860 is formed so as not to be connected to the connection conductor 87 and the redistribution layer 90. As a result, since the first film 860*c* is not connected to the connection conductor 87 and the redistribution layer 90, the first film 860*d* can be formed as either an insulating film or a conductive film. Furthermore, since the first film 860*c* is formed on the entire upper surface of the silicon substrate 81, scattering of exposure light on the upper surface of the silicon substrate 81 is suppressed, and connectivity between the entire upper surface of the silicon substrate 81 and the second film 862 can be improved.

Fourth Embodiment

The solid-state imaging device 1 according to the third embodiment is different from the solid-state imaging device 1 according to the first embodiment in that the first film 860*c* is not formed on the bottom portion of the through electrode 88*d* and the surface of the silicon substrate 81. Hereinafter, differences from the solid-state imaging device 1 according to the first embodiment will be described.

Figure 19:
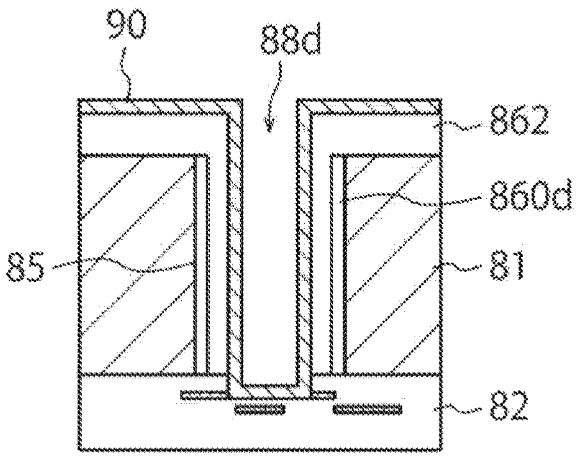
FIG. 19 is a diagram illustrating a through electrode according to a fourth embodiment.

FIG. 19 is a diagram illustrating the through electrode 88*d* according to a fourth embodiment. As illustrated in FIG. 19, the first film 860*c* is formed only on the side surface portion of the through electrode 88*d*.

Figure 20A:
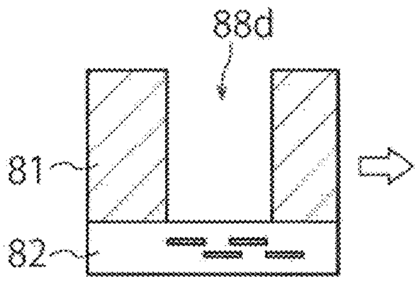
FIGS. 20A, 20B, 20C, 20D, 20E, 20F, and 20G are diagrams illustrating a manufacturing process example of the through electrode illustrated in FIG. 19.
Figure 20B:
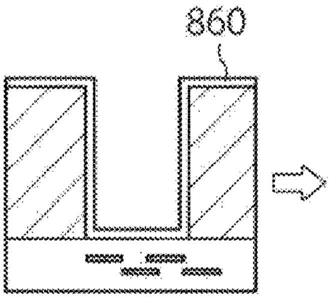
Figure 20C:
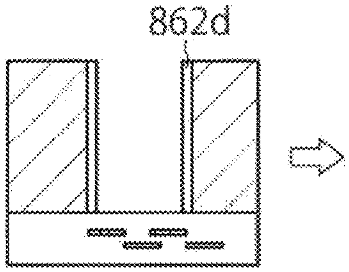
Figure 20D:
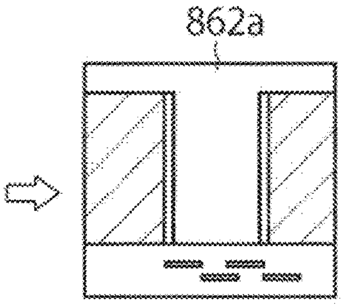
Figure 20E:
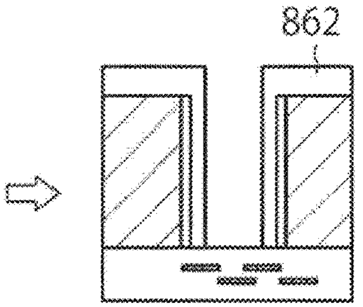
Figure 20F:
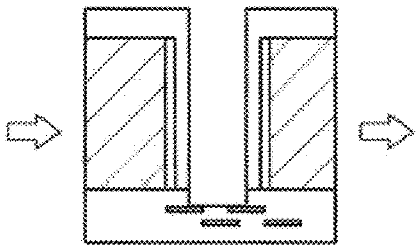
Figure 20G:
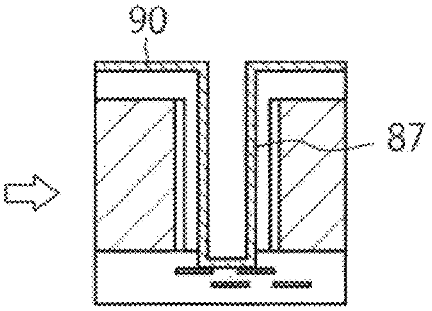

FIGS. 20A, 20B, 20C, 20D, 20E, 20F, and 20G are diagrams illustrating a manufacturing process example of the through electrode 88*c* illustrated in FIG. 19. As illustrated in FIGS. 20A, 20B, 20C, 20D, 20E, 20F, and 20G, the processing in FIG. 20C is added after the processing in FIG. 9B, which is different from the processing in FIGS. 9A, 9B, 9C, 9D, 9E, and 9F. As illustrated in FIG. 20C, the bottom portion of the through electrode 88*d* and the first film 860*b* on the surface of the silicon substrate 81 are removed by isotropic dry etching. At this time, since the isotropic dry etching is performed, the first film 860*c* on the side surface portion is not etched and remains.

As described above, according to the present embodiment, the first film 860*c* is formed only on the side surface portion of the through electrode 88*d*. This makes it possible to suppress scattering of exposure light only on the side surface portion of the through electrode 88*d*.

Fifth Embodiment

The solid-state imaging device 1 according to the first embodiment uses a negative type as the photosensitive insulating resin material 862*a*, but the solid-state imaging device 1 according to a fifth embodiment is different from the solid-state imaging device 1 according to the first embodiment in that a positive type is used as the photosensitive insulating material 862*a*. Hereinafter, differences from the solid-state imaging device 1 according to the first embodiment will be described.

Figure 21:
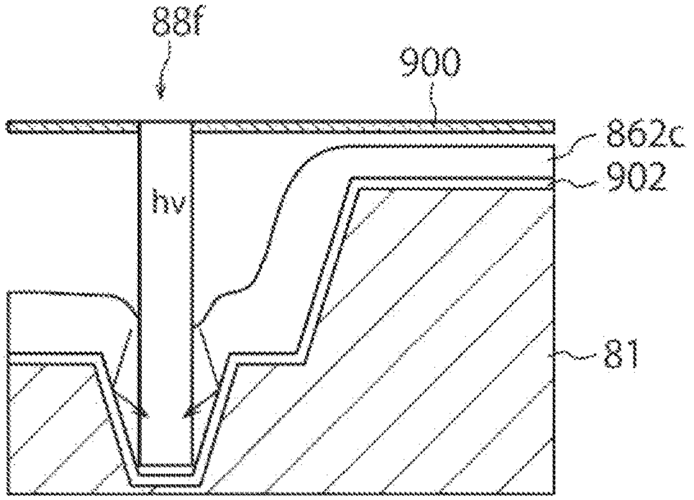
FIG. 21 is a diagram illustrating an example of lithography when a positive type is used for the second film.

FIG. 21 is a diagram illustrating an example of lithography when a positive type is used as the photosensitive insulating resin material for the second film 862*c*. For example, a processing step corresponding to the processing in FIG. 9C will be described. Furthermore, an example in which the first film 860 which is a light shielding film is not used will be described. As illustrated in FIG. 21, a plasma enhanced chemical vapor deposition (PVCD) film 902 and the second film 862*c* are stacked. In this case, when the mask 900 is transferred, the patterning resolution of the second film 862*c* is reduced by scattered light from the side surface of the through electrode 88*f*.

Figure 22:
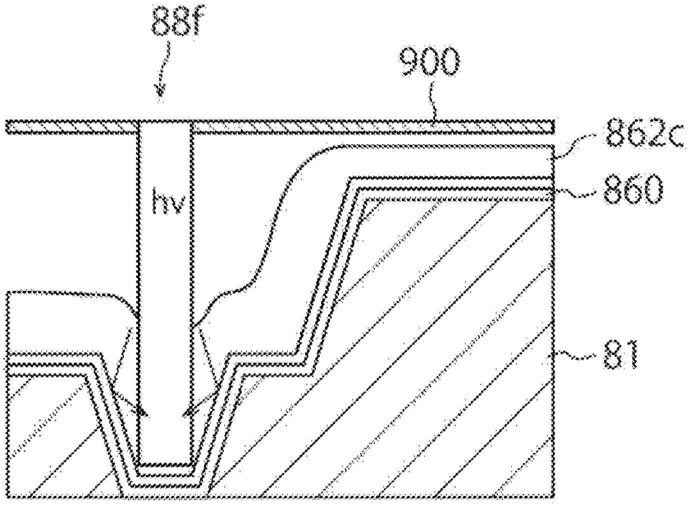
FIG. 22 is a diagram illustrating an example of lithography when a first film is stacked and a positive type is used for a second film.

FIG. 22 is a diagram illustrating an example of lithography when the first film 860 is stacked and a positive type is used as the photosensitive insulating resin material. For example, a processing step corresponding to the processing in the drawing (c) of FIG. 9C will be described. In this case, by using the first film 860 which is a light shielding film, scattered light from the side surface of the through electrode 88*f* is suppressed at the time of transferring the mask 900. As a result, a decrease in patterning resolution of the second film 862*c* is suppressed. Furthermore, the first film 860 can suppress a decrease in adhesion between the PVCD film 902 and the silicon substrate 81.

As described above, even in a case where a positive type is used for the photosensitive insulating material 862*a*, by stacking the first film 860 (ARL: antireflection film) on the hole-shaped portion, a decrease in patterning resolution of the second film 862*c* is suppressed.

<Configuration Example of Electronic Device>

The solid-state imaging device 1 as described above can be applied to, for example, various electronic devices such as an imaging system such as a digital still camera or a digital video camera, a mobile phone having an imaging function, or another device having an imaging function.

Figure 23:
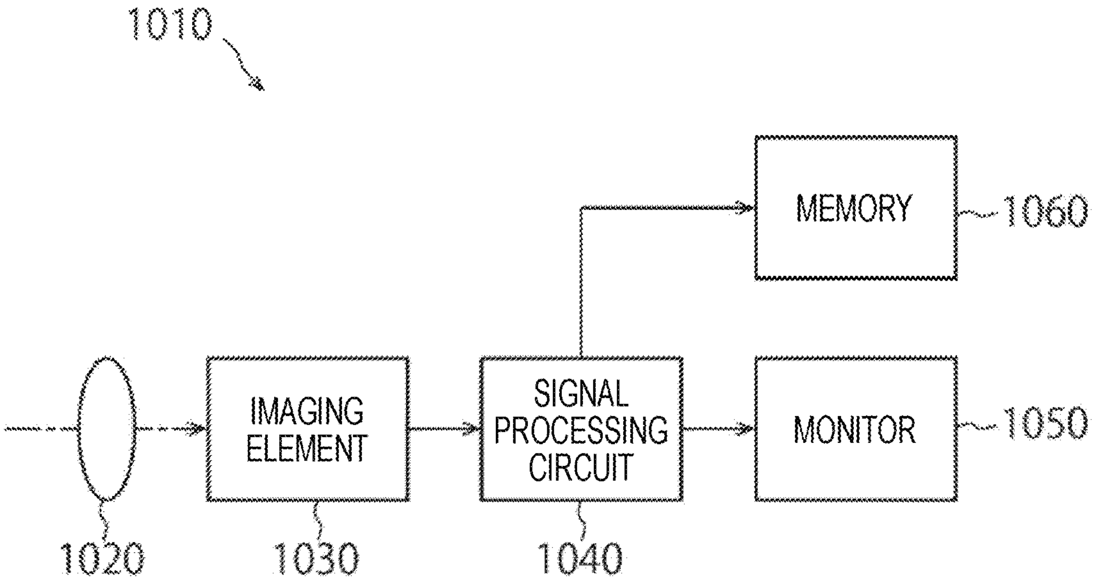
FIG. 23 is a block diagram illustrating a configuration example of an imaging device mounted on an electronic device.

FIG. 23 is a block diagram illustrating a configuration example of an imaging device mounted on an electronic device.

As illustrated in FIG. 23, an imaging device 1010 includes an optical system 1020, an imaging element 1030, a signal processing circuit 1040, a monitor 1050, and a memory 1060, and may take a still image and a moving image.

The optical system 1020 includes one or a plurality of lenses, and guides image light from an object (incident light) to the imaging element 1030 to form an image on a light-receiving surface (sensor unit) of the imaging element 1030.

As the imaging element 1030, the solid-state imaging device 1 described above is applied. Electrons are accumulated in the imaging element 1030 for a certain period in accordance with the image formed on the light-receiving surface via the optical system 1020. Then, a signal corresponding to the electrons accumulated in the imaging element 1030 is supplied to the signal processing circuit 1040.

The signal processing circuit 1040 performs various types of signal processing on a pixel signal output from the imaging element 1030. An image (image data) obtained by the signal processing applied by the signal processing circuit 1040 is supplied to the monitor 1050 to be displayed or supplied to the memory 1060 to be stored (recorded).

In the imaging device 1010 configured as described above, for example, more reliable imaging can be performed by applying the above-described solid-state imaging device 1.

<Usage Example of Image Sensor>

Figure 24:
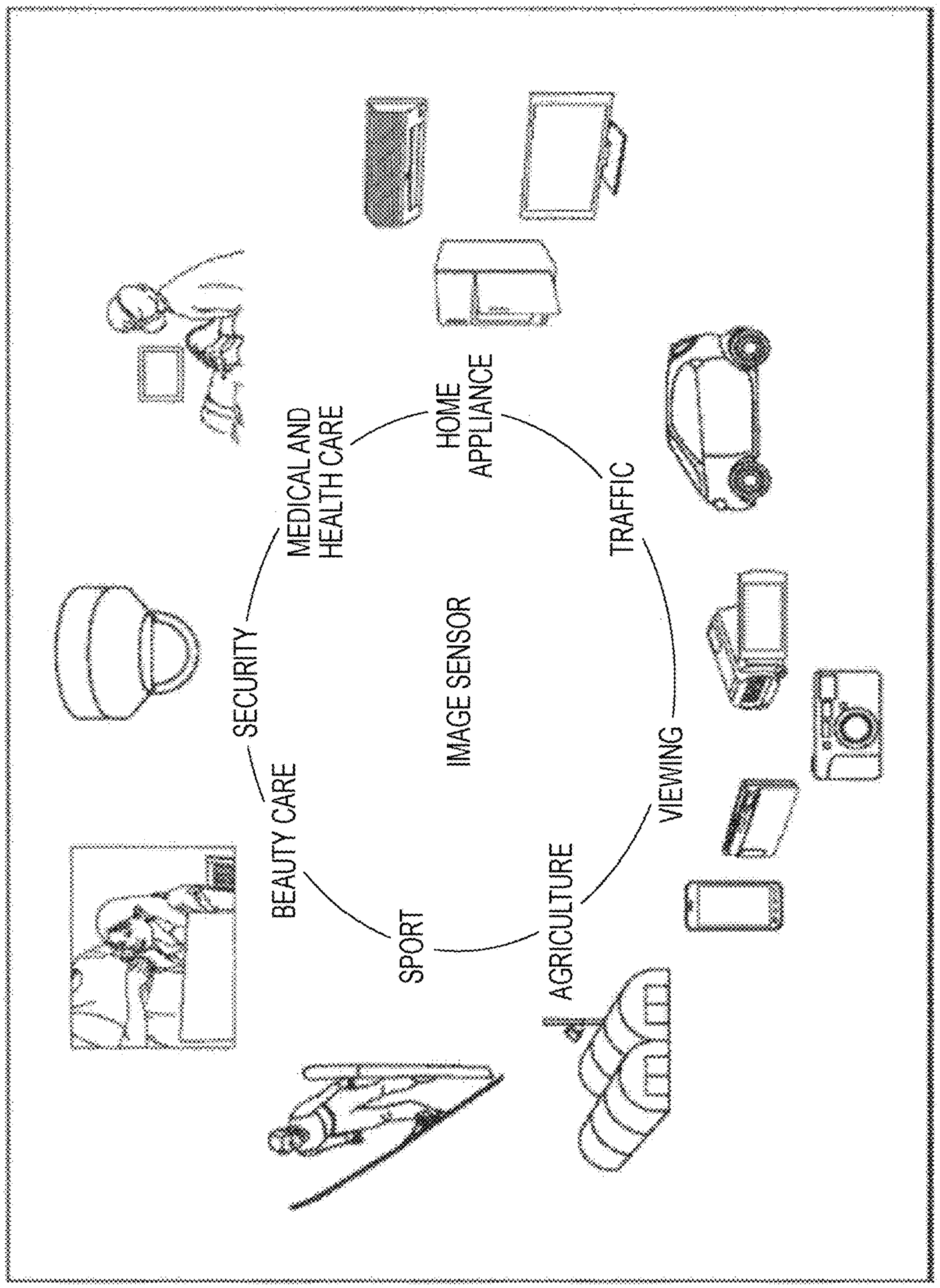
FIG. 24 is a diagram illustrating a usage example of using the above-described image sensor (solid-state imaging element device).

FIG. 24 is a diagram illustrating a usage example of using the above-described image sensor (solid-state imaging device).

The image sensor described above can be used in various cases for sensing light such as visible light, infrared light, ultraviolet light, and X-ray as described below, for example.

- A device which takes an image to be used for viewing such as a digital camera and portable equipment with a camera function
- A device for traffic purpose such as an in-vehicle sensor which takes images of the front, rear, surroundings, interior and the like of an automobile, a surveillance camera for monitoring traveling vehicles and roads, and a ranging sensor which measures a distance between vehicles and the like for safe driving such as automatic stop, recognition of a driver's condition and the like.
- A device for home appliance such as a television, a refrigerator, and an air conditioner that images a user's gesture and performs device operation according to the gesture
- A device for medical and health care use such as an endoscope and a device that performs angiography by receiving infrared light
- A device for security use such as a security monitoring camera and an individual authentication camera
- A device used for beauty care, such as a skin measuring instrument for photographing skin, and a microscope for photographing the scalp
- A device used for sport, such as an action camera or a wearable camera for sports applications or the like
- A device used for agriculture, such as a camera for monitoring a condition of a field or crop.

Note that the present technology can have configurations as follows.

(1) A semiconductor device including:

a first substrate including silicon;

a first film formed on at least some surfaces of a hole-shaped portion formed in the first substrate; and a photosensitive second film covering at least a part of a side surface of the hole-shaped portion with the first film interposed therebetween.

(2) The semiconductor device according to (1), in which the first film absorbs light having a wavelength sensitive to the second film.

(3) The semiconductor device according to (2), in which the first film has a different thickness depending on a position where the first film is formed.

(4) The semiconductor device according to (3), in which the first film has different absorption characteristics or reflection characteristics of the light depending on the thickness.

(5) The semiconductor device according to any one of (1) to (4), in which the first film has an adsorption force of a predetermined value or more with respect to the first substrate and the second film.

(6) The semiconductor device according to any one of (1) to (5), in which the first film is a substance containing at least one of silicon nitride (SiN), silicon oxynitride (SiOxNy), or titanium nitride (TiN).

(7) The semiconductor device according to any one of (1) to (6), in which the second film is an insulating film.

(8) The semiconductor device according to (7), in which the second film is a substance containing at least one of polyimide, silicone, acryl, epoxy, or spin-on carbon (SOC).

(9) The semiconductor device according to any one of (1) to (8), further including a multilayer wiring layer connected to the first substrate, in which the hole-shaped portion is a through hole penetrating the multilayer wiring layer from one surface of the first substrate.

(10) The semiconductor device according to (9) further including:

- a first connection conductor that covers the multilayer wiring layer through which the through hole penetrates and the through hole in which the second film is formed;
- an electrode formed on a side of the one surface of the first substrate and electrically connected to an external substrate; and
- a second connection conductor that connects the connection conductor and the electrode.

(11) The semiconductor device according to (10), in which the first film is formed on at least a part of the one surface of the first substrate, a side wall surface of the through hole, and a surface of the multilayer wiring layer on a side of the first substrate.

(12) The semiconductor device according to (10), in which the first film is formed only on a side wall surface of the through hole.

(13) The semiconductor device according to (10), in which the first film is formed only on a bottom portion of the through hole.

(14) The semiconductor device according to any one of (10) to (13), in which the second film is formed on the one surface of the first substrate and a side wall surface of the through hole.

(15) The semiconductor device according to any one of (1) to (14), in which at least one of a logic circuit, a memory circuit, a control circuit, or an interposer are configured in the multilayer wiring layer.

(16) The semiconductor device according to (15), further including a second semiconductor substrate formed with a pixel region in which pixel units that perform photoelectric conversion are two-dimensionally arranged, in which the logic circuit processes a pixel signal output from the pixel units.

(17) An electronic device including:

- a first substrate including silicon;
- a first film formed on at least some surfaces of a hole-shaped portion formed in the first substrate; and
- a photosensitive second film covering at least a part of a side surface of the hole-shaped portion with the first film interposed therebetween.

(18) A method for manufacturing a semiconductor device including steps of:

- forming a first hole-shaped portion in a first substrate including silicon;
- forming a first film in the first hole-shaped portion;
- depositing a photosensitive material on the first hole-shaped portion in which the first film has been formed;
- exposing a predetermined region of the photosensitive material to light;
- patterning the photosensitive material that has been exposed to light; and
- etching a bottom portion of the first hole-shaped portion.

Aspects of the present disclosure are not limited to the above-described individual embodiments, but include various modifications that can be conceived by those skilled in the art, and the effects of the present disclosure are not limited to the above-described contents. That is, various additions, modifications, and partial deletions are possible without departing from the conceptual idea and spirit of the present disclosure derived from the matters defined in the claims and equivalents thereof.

REFERENCE SIGNS LIST

1 Solid-state imaging device (semiconductor device)
81 Silicon substrate
82 Multilayer wiring layer
85 Silicon through hole
87 Connection conductor
90 Redistribution layer
860, 860*a*, 860*b*, 860*c* First film
862, 862*c* Second film

The invention claimed is:

1. A semiconductor device, comprising:

- a first substrate that includes:
  - silicon;
  - a semiconductor substrate that includes a hole-shaped portion; and
  - a multilayer wiring layer connected to the semiconductor substrate, wherein
    - the hole-shaped portion is a through hole that penetrates the multilayer wiring layer from a surface of the semiconductor substrate, and
    - the multilayer wiring layer includes a logic circuit;
- a first film on at least one surface of the hole-shaped portion;
- a photosensitive second film that covers at least a part of a side surface of the hole-shaped portion, wherein
  - the at least one surface of the hole-shaped portion includes the side surface of the hole-shaped portion, and
  - the first film is between the side surface of the hole-shaped portion and the photosensitive second film; and
- a second substrate includes a pixel region, wherein
  - the pixel region includes pixel units, and
  - the second substrate is different from the first substrate.

2. The semiconductor device according to claim 1, wherein the first film absorbs light having a wavelength sensitive to the photosensitive second film.

3. The semiconductor device according to claim 2, wherein the first film has a different thickness depending on a position where the first film is formed.

4. The semiconductor device according to claim 3, wherein the first film has different absorption characteristics or reflection characteristics of the light depending on the thickness.

5. The semiconductor device according to claim 1, wherein the first film has an adsorption force of one of specific value or more than the specific value with respect to the first substrate and the photosensitive second film.

6. The semiconductor device according to claim 1, wherein the first film is a substance that includes at least one of silicon nitride (SiN), silicon oxynitride (SiOxNy), or titanium nitride (TiN).

7. The semiconductor device according to claim 1, wherein the photosensitive second film is an insulating film.

8. The semiconductor device according to claim 7, wherein the photosensitive second film is a substance that includes at least one of polyimide, silicone, acryl, epoxy, or spin-on carbon (SOC).

9. The semiconductor device according to claim 1, further comprising:

a first connection conductor that covers the multilayer wiring layer;

an electrode on a side of the surface of the semiconductor substrate, wherein the electrode is electrically connected to an external substrate; and a second connection conductor that connects the first connection conductor and the electrode.

10. The semiconductor device according to claim 9, wherein the first film is on at least a part of the surface of the semiconductor substrate, a side wall surface of the through hole, or a surface of the multilayer wiring layer on a side of the semiconductor substrate.

11. The semiconductor device according to claim 9, wherein the first film is formed only on a side wall surface of the through hole.

12. The semiconductor device according to claim 9, wherein the first film is formed only on a bottom portion of the through hole.

13. The semiconductor device according to claim 9, wherein the photosensitive second film is formed on a surface of the first substrate and a side wall surface of the through hole.

14. The semiconductor device according to claim 1, wherein the multilayer wiring layer further includes at least one of a memory circuit, a control circuit, or an interposer.

15. The semiconductor device according to claim 14, wherein the pixel units are configured to:

execute photoelectric conversion; and output a pixel signal based on the photoelectric conversion, the pixel units are two-dimensionally arranged, and the logic circuit is configured to process the pixel signal.

* * * * *